US012213320B2

(12) United States Patent
Shimabukuro et al.

(10) Patent No.: US 12,213,320 B2
(45) Date of Patent: Jan. 28, 2025

(54) THREE-DIMENSIONAL MEMORY DEVICE WITH FINNED SUPPORT PILLAR STRUCTURES AND METHODS FOR FORMING THE SAME

(71) Applicant: SANDISK TECHNOLOGIES LLC, Addison, TX (US)

(72) Inventors: Seiji Shimabukuro, Yokkaichi (JP); Takashi Yamaha, Obu (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 651 days.

(21) Appl. No.: 17/328,302

(22) Filed: May 24, 2021

(65) Prior Publication Data
US 2022/0375958 A1   Nov. 24, 2022

(51) Int. Cl.
| H10B 43/50 | (2023.01) |
| H01L 21/768 | (2006.01) |
| H10B 41/10 | (2023.01) |
| H10B 41/27 | (2023.01) |
| H10B 41/50 | (2023.01) |
| H10B 43/10 | (2023.01) |
| H10B 43/27 | (2023.01) |

(Continued)

(52) U.S. Cl.
CPC ....... *H10B 43/50* (2023.02); *H01L 21/76802* (2013.01); *H01L 21/76829* (2013.01); *H10B 41/10* (2023.02); *H10B 41/27* (2023.02); *H10B 41/50* (2023.02); *H10B 43/10* (2023.02); *H10B 43/27* (2023.02); *H10B 51/10* (2023.02); *H10B 51/20* (2023.02); *H10B 51/50* (2023.02); *H01L 23/5226* (2013.01)

(58) Field of Classification Search
CPC .......... H01L 27/1157; H01L 27/11582; H10B 41/50
See application file for complete search history.

(56) References Cited

U.S. PATENT DOCUMENTS

| 9,728,499 | B2 * | 8/2017 | Shimabukuro | ........ H10B 43/27 |
| 9,853,038 | B1 * | 12/2017 | Cui | ........................ H10B 43/35 |

(Continued)

FOREIGN PATENT DOCUMENTS

CN   208298831 U   12/2018

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Yu-Hsi D Sun
(74) *Attorney, Agent, or Firm* — THE MARBURY LAW GROUP PLLC

(57) ABSTRACT

A three-dimensional memory device includes an alternating stack of insulating layers and electrically conductive layers located over a substrate, memory openings vertically extending through a first region of the alternating stack, memory opening fill structures located in the memory openings, and support pillar structures vertically extending through a second region of the alternating stack. Each of the support pillar structures includes a central columnar structure and a set of fins laterally protruding from the central columnar structure at levels of a subset of the electrically conductive layers.

20 Claims, 35 Drawing Sheets

(51) Int. Cl.
    *H10B 51/10*           (2023.01)
    *H10B 51/20*           (2023.01)
    *H10B 51/50*           (2023.01)
    *H01L 23/522*         (2006.01)

(56) References Cited

U.S. PATENT DOCUMENTS

| | | | |
|---|---|---|---|
| 10,115,681 B1 * | 10/2018 | Ariyoshi | H10B 43/10 |
| 10,256,245 B2 | 4/2019 | Ariyoshi | |
| 10,256,252 B1 * | 4/2019 | Kanazawa | H01L 29/40117 |
| 10,269,820 B1 | 4/2019 | Kaminaga | |
| 10,304,852 B1 | 5/2019 | Cui et al. | |
| 10,381,434 B1 | 8/2019 | Pachamuthu et al. | |
| 10,395,974 B1 * | 8/2019 | Chou | H01L 21/76256 |
| 10,475,879 B1 | 11/2019 | Pachamuthu et al. | |
| 10,629,616 B1 | 4/2020 | Kai et al. | |
| 10,672,780 B1 | 6/2020 | Kawamura et al. | |
| 10,854,629 B2 | 12/2020 | Ge et al. | |
| 10,957,706 B2 | 3/2021 | Otsu et al. | |
| 10,971,514 B2 | 4/2021 | Otsu et al. | |
| 2006/0076602 A1 | 4/2006 | Harter et al. | |
| 2007/0284650 A1 | 12/2007 | Willer | |
| 2008/0230824 A1 | 9/2008 | Doornbos et al. | |
| 2009/0242964 A1 | 10/2009 | Akil et al. | |
| 2013/0037877 A1 | 2/2013 | Tan et al. | |
| 2014/0061576 A1 | 3/2014 | Toh et al. | |
| 2015/0123068 A1 | 5/2015 | Toh et al. | |
| 2015/0162339 A1 | 6/2015 | Divakaruni et al. | |
| 2015/0214239 A1 | 7/2015 | Rhie | |
| 2016/0093630 A1 | 3/2016 | Tan et al. | |
| 2016/0148946 A1 * | 5/2016 | Hironaga | H10B 43/27 |
| | | | 438/586 |
| 2016/0197082 A1 | 7/2016 | Park et al. | |
| 2016/0218222 A1 | 7/2016 | Divakaruni et al. | |
| 2017/0236835 A1 * | 8/2017 | Nakamura | H01L 28/00 |
| | | | 257/314 |
| 2018/0053773 A1 | 2/2018 | Leobandung | |
| 2018/0151623 A1 | 5/2018 | Terai | |
| 2018/0166456 A1 | 6/2018 | Leobandung | |
| 2018/0261613 A1 | 9/2018 | Ariyoshi | |
| 2019/0164980 A1 | 5/2019 | Balakrishnan et al. | |
| 2019/0214398 A1 | 7/2019 | Balakrishnan et al. | |
| 2019/0221610 A1 | 7/2019 | Delhougne et al. | |
| 2019/0245142 A1 | 8/2019 | Terai | |
| 2019/0252396 A1 | 8/2019 | Mushiga et al. | |
| 2019/0252403 A1 | 8/2019 | Kaminaga et al. | |
| 2020/0098826 A1 | 3/2020 | Sharma et al. | |
| 2020/0411527 A1 | 12/2020 | Yang | |

OTHER PUBLICATIONS

U.S. Appl. No. 16/809,861, filed Mar. 5, 2020, SanDisk Technologies LLC.
U.S. Appl. No. 16/916,476, filed Jun. 30, 2020, SanDisk Technologies LLC.
U.S. Appl. No. 17/036,070, filed Sep. 29, 2020, SanDisk Technologies LLC.
U.S. Appl. No. 17/039,160, filed Sep. 30, 2020, SanDisk Technologies LLC.
U.S. Appl. No. 17/106,792, filed Nov. 30, 2020, SanDisk Technologies LLC.
U.S. Appl. No. 17/155,512, filed Jan. 22, 2021, SanDisk Technologies LLC.
U.S. Appl. No. 17/169,987, filed Feb. 8, 2021, SanDisk Technologies LLC.
U.S. Appl. No. 17/174,064, filed Feb. 11, 2021, SanDisk Technologies LLC.
U.S. Appl. No. 17/174,094, filed Feb. 11, 2021, SanDisk Technologies LLC.
U.S. Appl. No. 17/192,463, filed Mar. 4, 2021, SanDisk Technologies LLC.
ISR—Notification of Transmittal of The International Search Report and Written Opinion of the International Searching Authority for International Patent Application No. PCT/US2021/065392, mailed May 3, 2022, 10 pages.

* cited by examiner

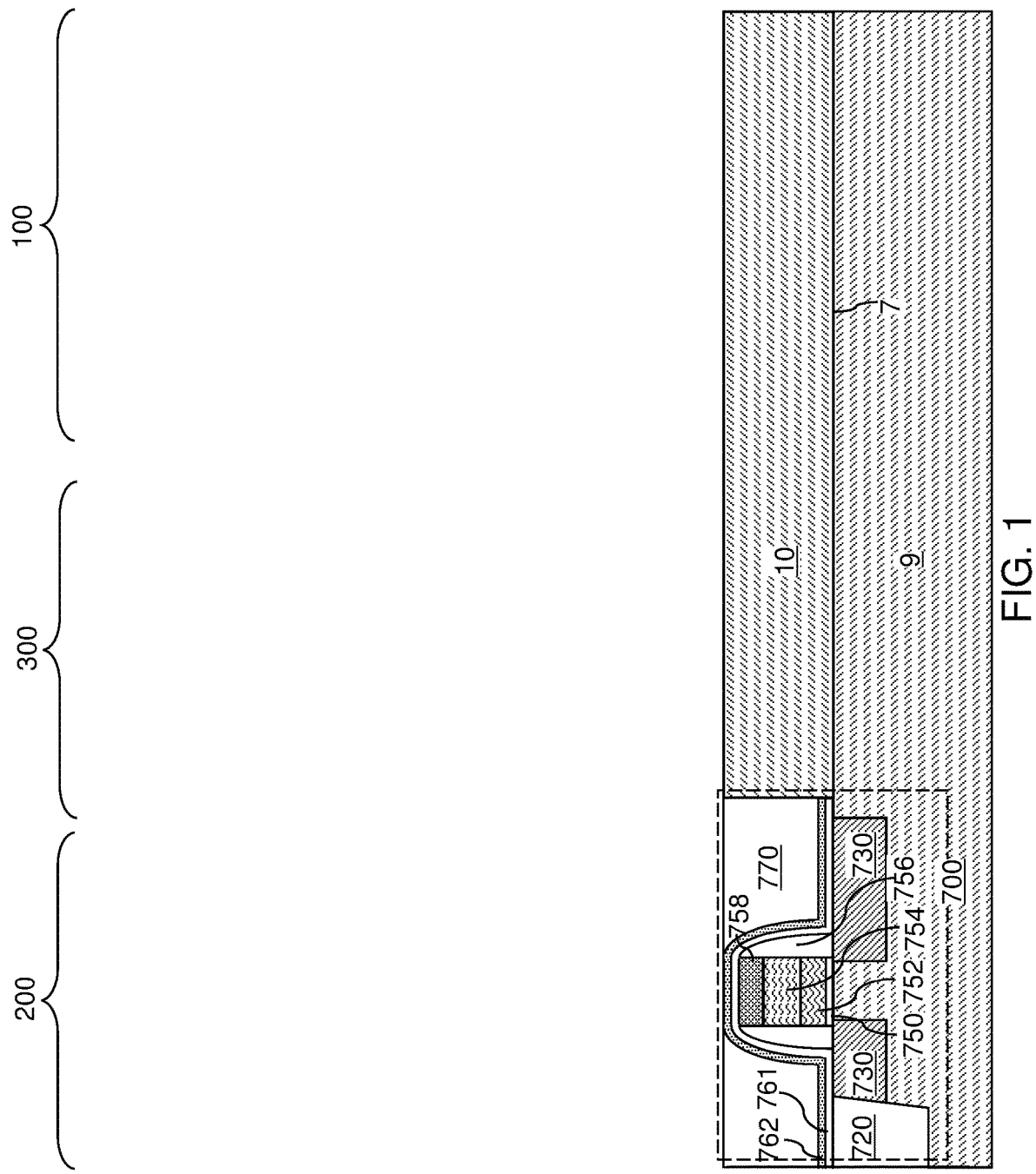

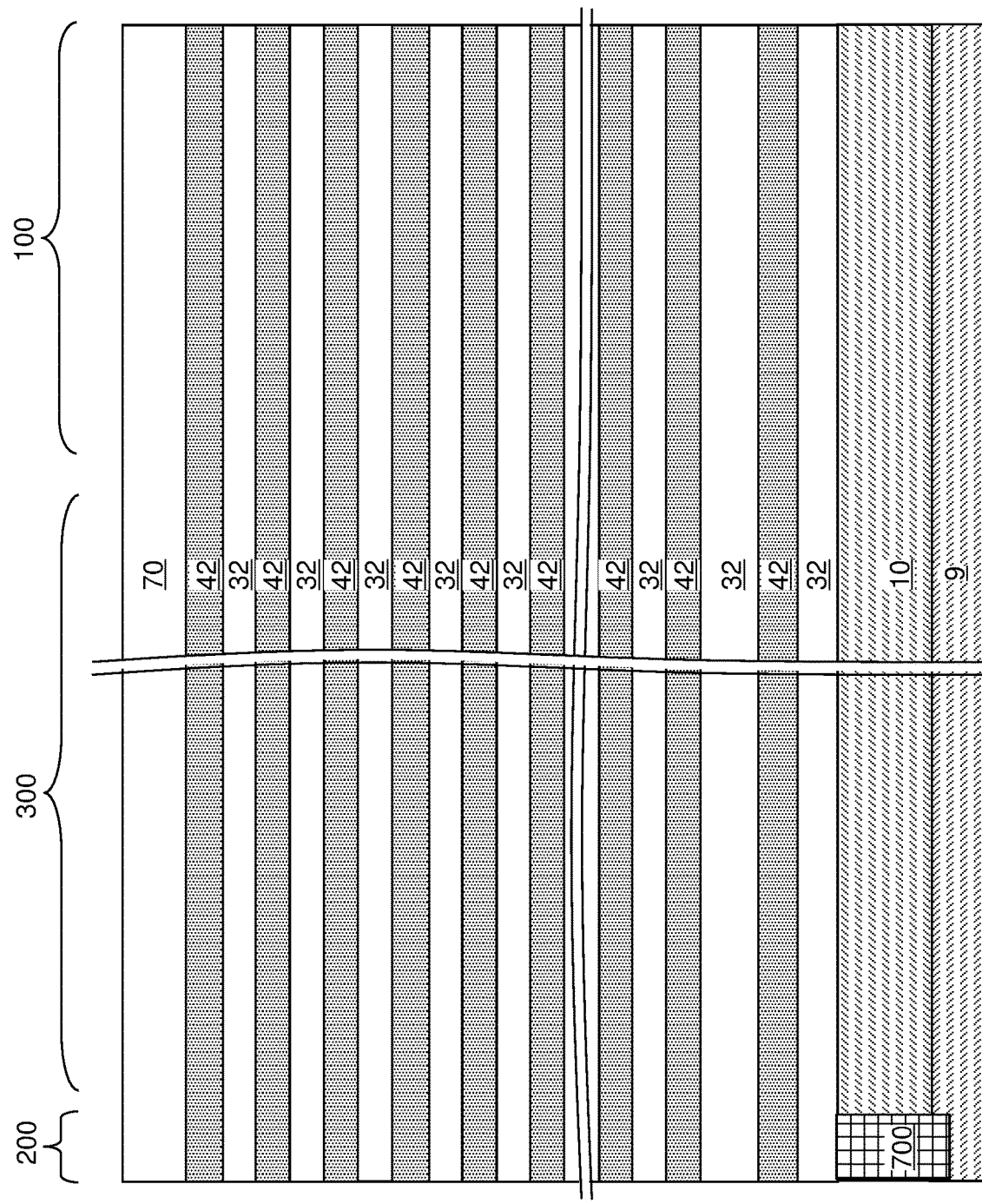

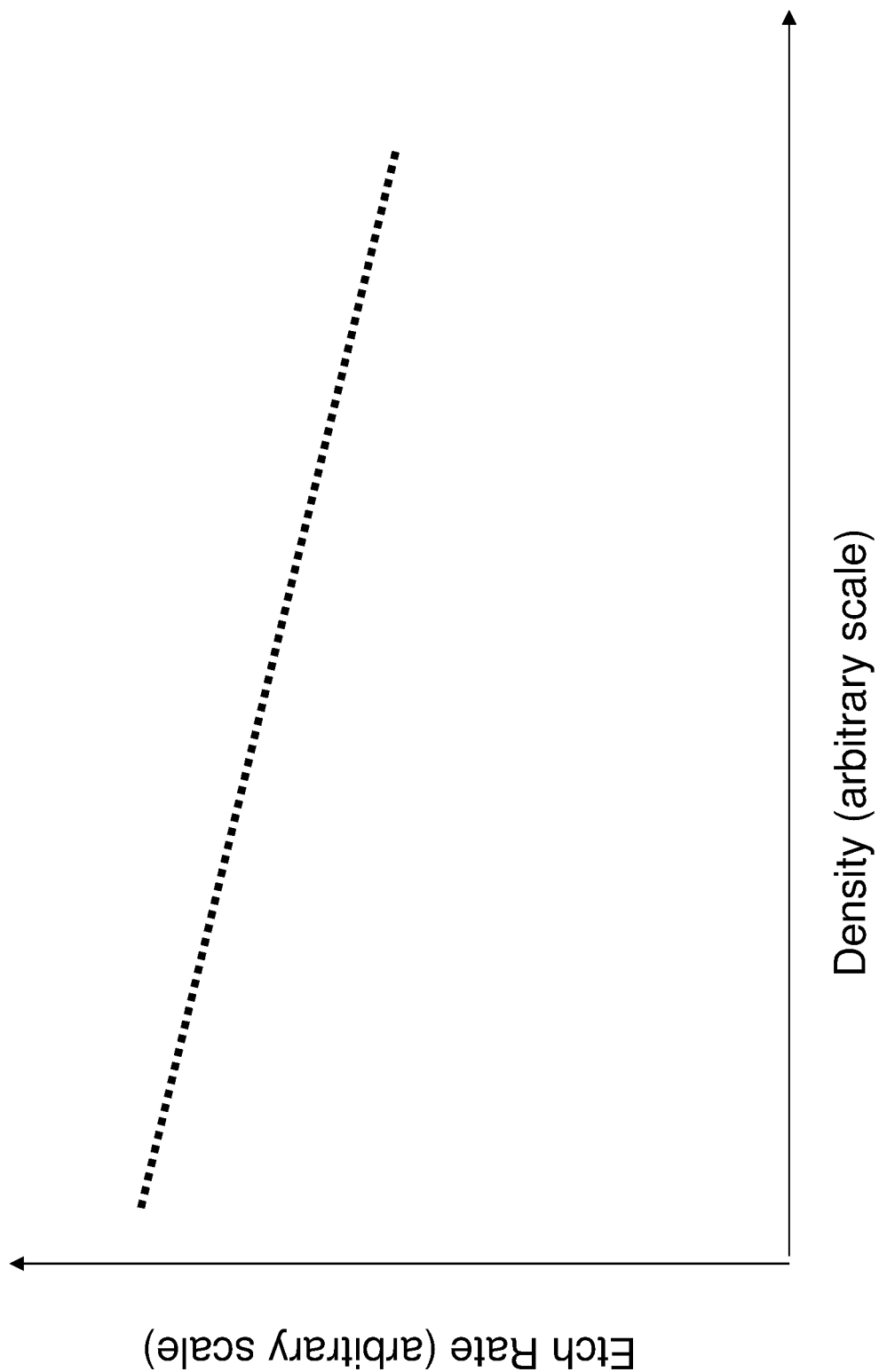

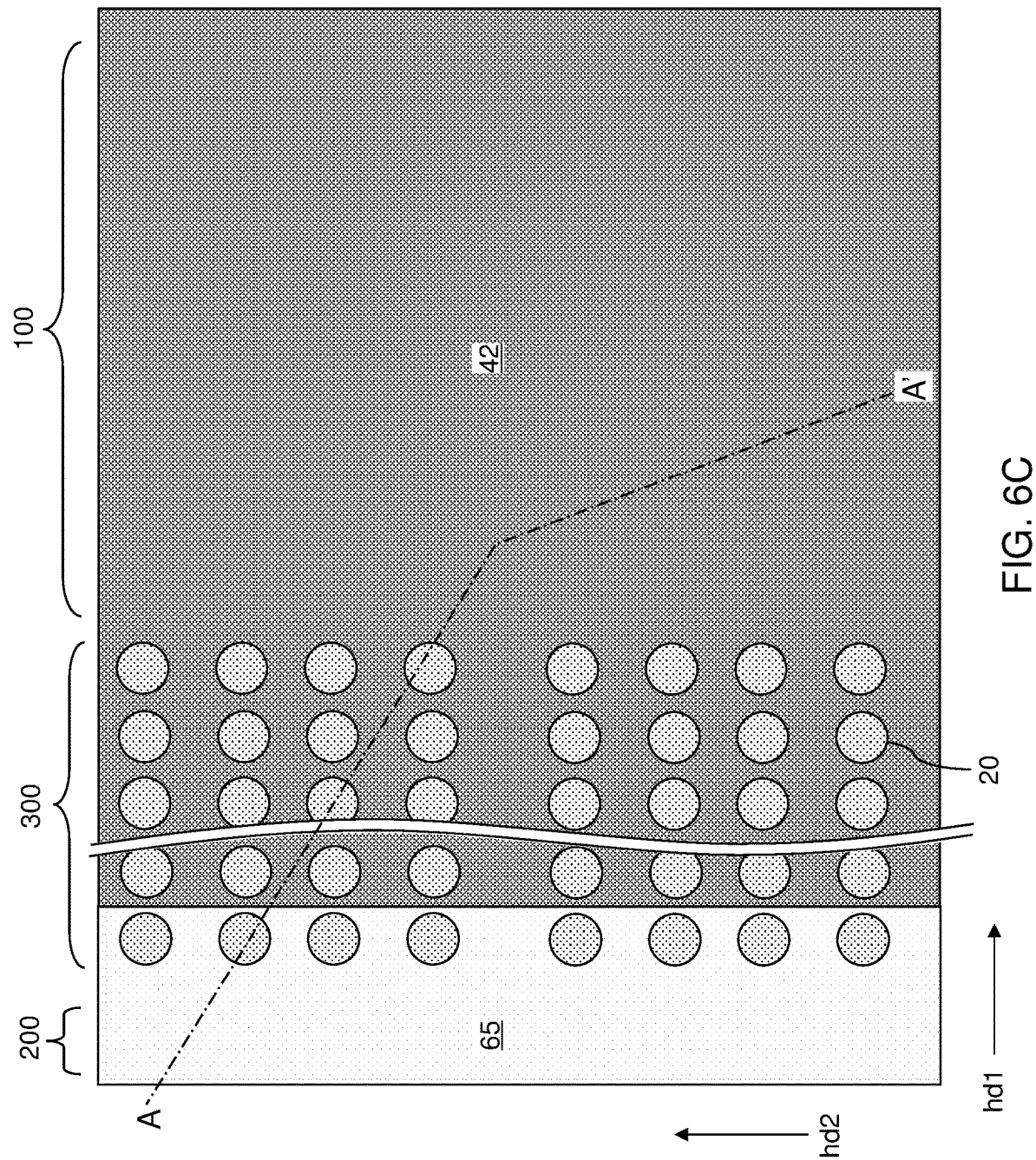

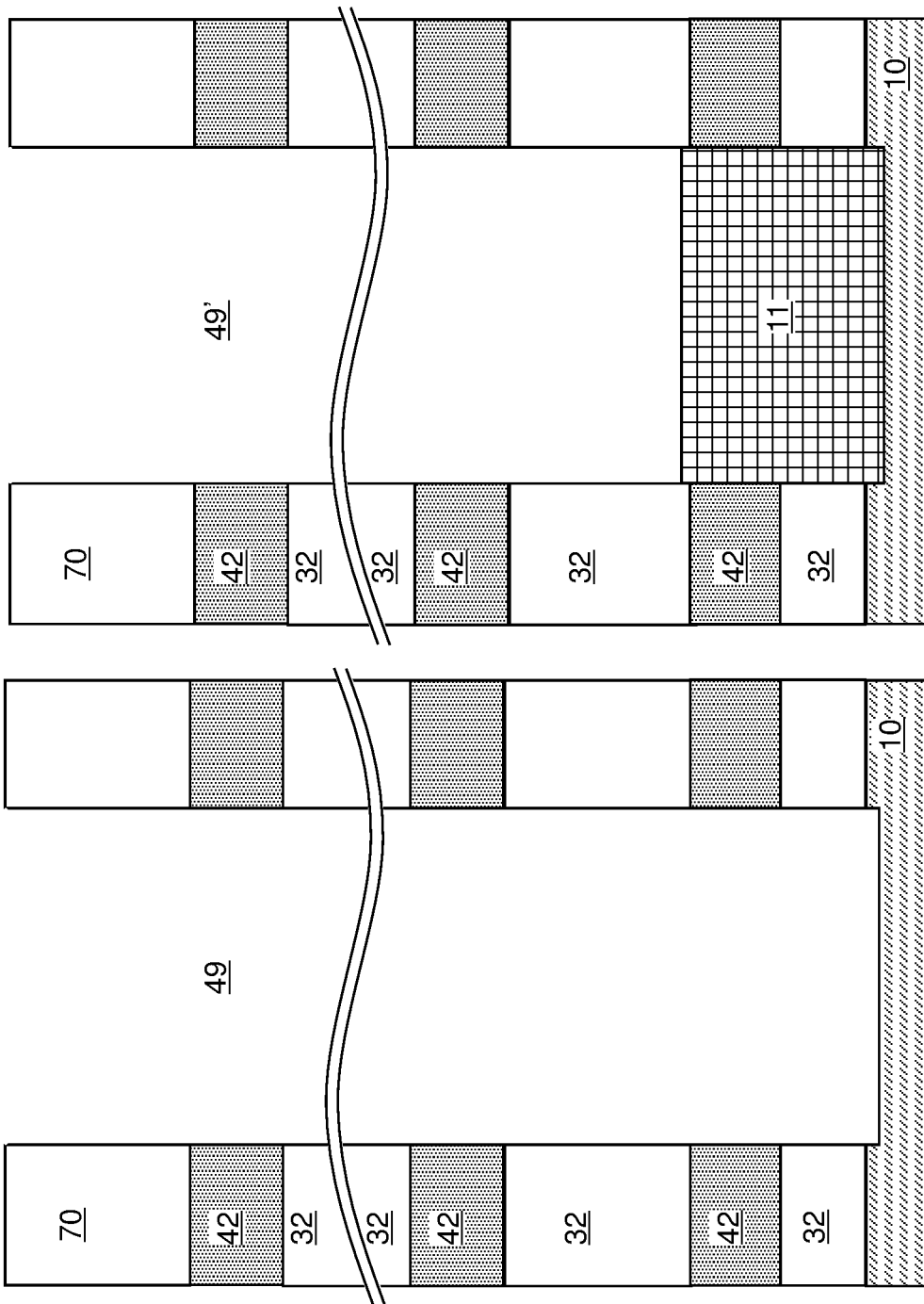

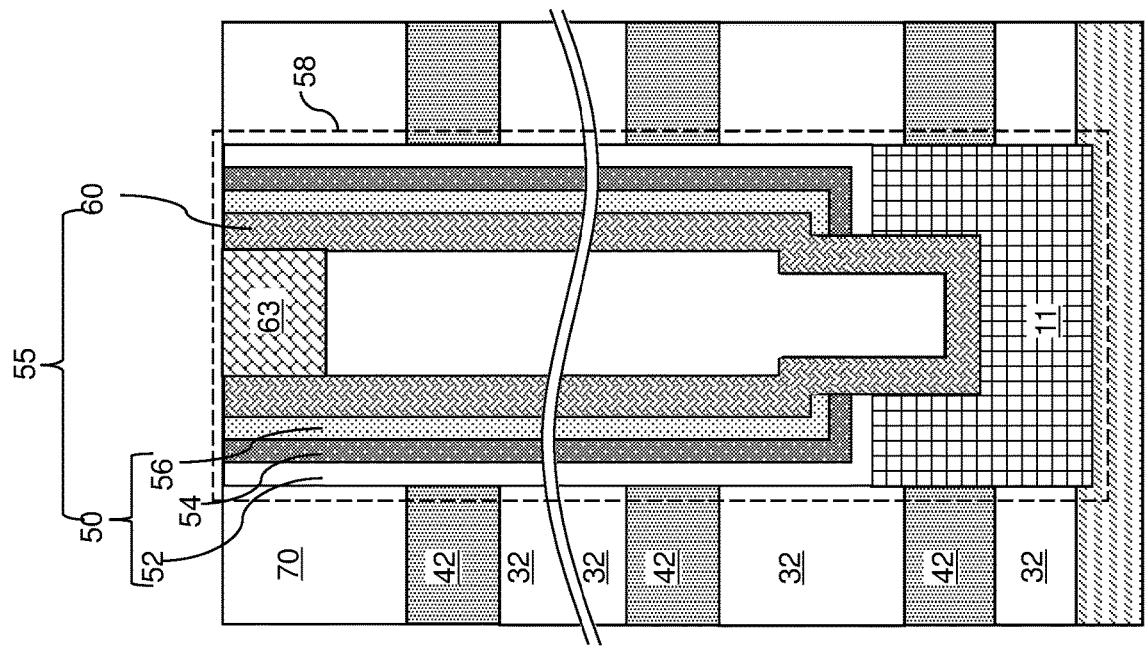
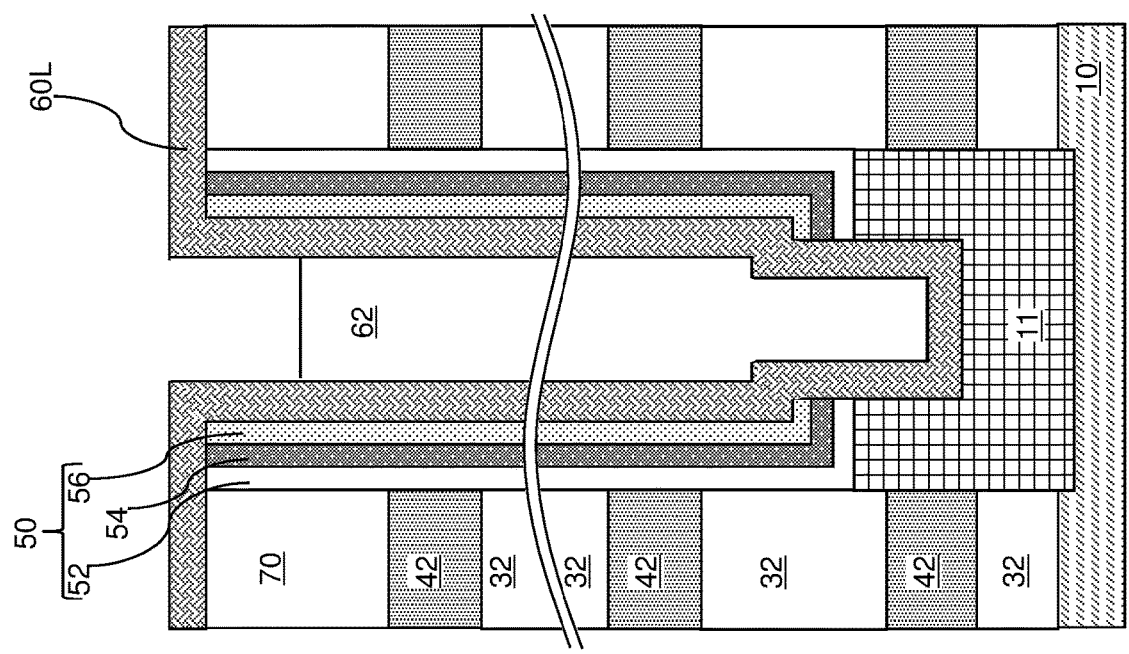
FIG. 8H
FIG. 8G

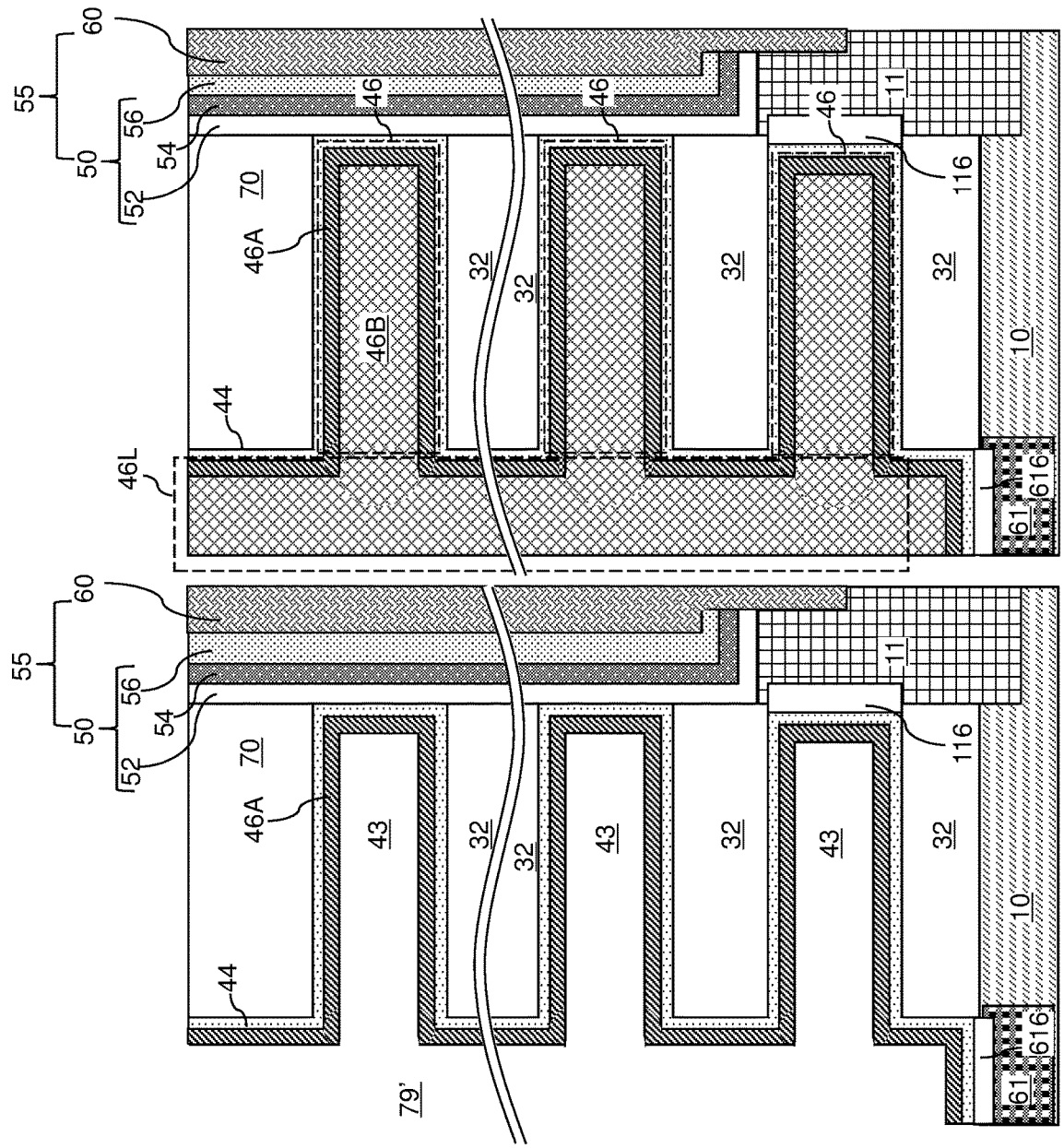

THREE-DIMENSIONAL MEMORY DEVICE WITH FINNED SUPPORT PILLAR STRUCTURES AND METHODS FOR FORMING THE SAME

FIELD

The present disclosure relates generally to the field of semiconductor devices, and particularly to a three-dimensional memory device containing finned support pillar structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers; memory openings vertically extending through a first region of the alternating stack; memory opening fill structures located in the memory openings and comprising a respective vertical stack of memory elements located levels of the electrically conductive layers; and a support pillar structure vertically extending through a second region of the alternating stack and comprising a central columnar structure and a set of fins laterally protruding from the central columnar structure at levels of a subset of the electrically conductive layers.

According to another aspect of the present disclosure, a method of forming a three-dimensional memory device is provided, which comprises: forming an alternating stack of insulating layers and sacrificial material layers over a substrate; forming support openings through the alternating stack; laterally recessing the sacrificial material layers selective to the insulating layers around the support openings by introducing into the support openings an isotropic etchant that etches the sacrificial material layers selective to the insulating layers, wherein fin cavities are formed in volumes from the sacrificial material layers are etched; forming support pillar structure in volumes of the support openings and the fin cavities by depositing at least one fill material in the support openings and the fin cavities, wherein each of the support pillar structures comprises a central columnar structure and a set of fins laterally protruding from the central columnar structure at levels of a subset of the sacrificial material layers; forming memory openings through a region of the alternating stack that is laterally spaced from the support pillar structures; forming memory opening fill structures in the memory openings, wherein each of the memory opening fill structures comprises a respective vertical stack of memory elements located at levels of the sacrificial material layers; and replacing the sacrificial material layers with electrically conductive layers.

BRIEF DESCRIPTION OF THE DRAWINGS

FIG. 1 is a schematic vertical cross-sectional view of a first exemplary structure after formation of at least one peripheral device, a semiconductor material layer, and a gate dielectric layer according to an embodiment of the present disclosure.

FIG. 2A is a schematic vertical cross-sectional view of the first exemplary structure after formation of an alternating stack of insulating layers and sacrificial material layers according to an embodiment of the present disclosure.

FIG. 2B is a graph illustrating the change in the etch rate in an isotropic etchant of the sacrificial material layers as a function of their density.

FIG. 6C is a horizontal cross-sectional view along the horizontal plane C-C' of the first exemplary structure of FIG. 6A. The vertical plane A-A' is the plane of the cross-section for FIG. 6A.

FIGS. 8A-8H are sequential schematic vertical cross-sectional views of a memory opening within the first exemplary structure during formation of a memory stack structure, an optional dielectric core, and a drain region therein according to an embodiment of the present disclosure.

FIGS. 12A-12D are sequential vertical cross-sectional views of a region of the first exemplary structure during formation of electrically conductive layers according to an embodiment of the present disclosure.

DETAILED DESCRIPTION

Figure 2C:
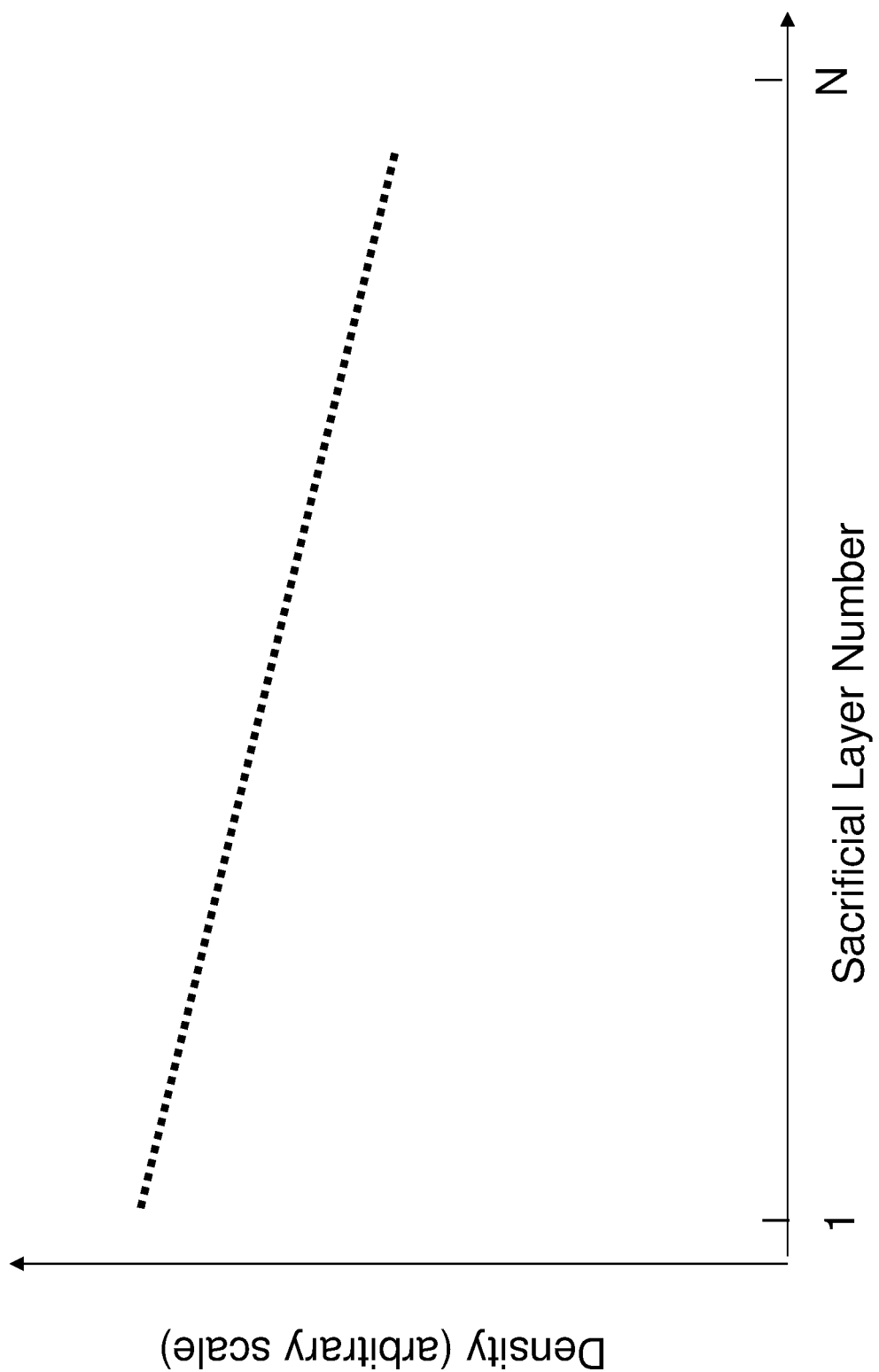
FIG. 2C is a graph illustrating the change in the density of the sacrificial material layers as a function of a sacrificial layer number as counted from bottom in the first exemplary configuration of the first exemplary structure according to an embodiment of the present disclosure.

As discussed above, the embodiments of the present disclosure are directed to a three-dimensional memory device employing finned support pillar structures and methods of manufacturing the same, the various aspects of which are described below. The finned support pillar structures permit the support pillar structures to be spaced farther apart due to the support for the insulating layers of a layer stack provided by the fins after sacrificial material layers are removed. By spacing the support pillar structures farther apart, more word line metal can be provided into the recesses between the insulating layers, which reduces word line resistance. Furthermore, the fins decrease the amount of deformation of the insulating layers due to compressive stress on the insulating layers after the sacrificial material layers are removed. Finally, the diameter of the core portion of the support openings in which the support pillar structures are located can be reduced. The reduced diameter of the core portion helps control the depth of the support openings during the etching process that forms the support openings.

The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Referring to FIGS. 2A-2E a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

According to an aspect of the present disclosure, the sacrificial material layers 42 comprise at least two types of sacrificial material layers having different densities and different etch rates in an isotropic etchant, such as hot phosphoric acid. For example, the sacrificial material layers 42 may comprise at least one first sacrificial material layer having a first etch rate in the isotropic etchant, and at least one second sacrificial material layer having a second etch rate in the isotropic etchant that is greater than the first etch rate. The at least one second sacrificial material layer may overly the at least one first sacrificial material layer. In one embodiment, the sacrificial material layers 42 may comprise at least one third sacrificial material layer having a third etch rate in the isotropic etchant that is greater than the second etch rate. The at least one third sacrificial material layer may overly the second sacrificial material layer. Generally, the sacrificial material layers 42 may comprise a total of M types of sacrificial material layers having a respective sacrificial material composition. Each i-th type sacrificial material layer overlies each (i−1)-th type sacrificial material layer for each integer i in a range from 2 to M. Each i-th type sacrificial material layer has an i-th etch rate in the isotropic etchant that is greater than the (i−1)-th etch rate in the isotropic etchant of each (i−1)-th type sacrificial material layer for each integer i in a range from 2 to M. The integer M may be in a range from 2 to N, in which N is the total number of sacrificial material layers 42. The number N may be in a range from 8 to 1,024, such as from 64 to 256, although lesser and greater numbers may also be employed. The integer M may be in a range from 2 to 1,024, such as from 8 to 256, and/or from 32 to 128.

In an illustrative example, the sacrificial material layers 42 may comprise at least one first silicon nitride layer having a first etch rate in hot phosphoric acid, and at least one second silicon nitride layer having a second etch rate in hot phosphoric acid that is greater than the first etch rate and overlying the at least one first silicon nitride layer. In one embodiment, the sacrificial material layers 42 may comprise a third silicon nitride layer having a third etch rate in hot phosphoric acid that is greater than the second etch rate and overlying the second silicon nitride layer. Generally, the sacrificial material layers 42 may comprise a total of M types of silicon nitride layers having a respective silicon nitride composition. Each i-th type silicon nitride layers overlies each (i−1)-th type silicon nitride layer for each integer i in a range from 2 to M. Each i-th type silicon nitride layer has an i-th etch rate in hot phosphoric acid that is greater than the (i−1)-th etch rate in hot phosphoric acid of each (i−1)-th type silicon nitride layer for each integer i in a range from 2 to M.

In one embodiment, the sacrificial material layers 42 may comprise silicon nitride layers having different densities in a range from 2.55 g/cm$^3$ to 2.80 g/cm$^3$. As shown in FIG. 2B, the greater density silicon nitride layers may have a lower etch rate than the lower density silicon nitride layers. The silicon nitride layers may be deposited by a plasma enhanced chemical vapor deposition process in which a lower plasma power leads to a higher density and a higher plasma power leads to a lower density. Therefore, the at least one first silicon nitride layer (e.g., lower silicon nitride layer)

may be deposited at a higher plasma power to be more porous and thus have a higher etching rate in hot phosphoric acid. In contrast, the at least one second silicon nitride layer (e.g., upper silicon nitride layer) may be deposited at a lower plasma power to be less porous (i.e., be denser) and thus have a lower etching rate in hot phosphoric acid.

Figure 2D:
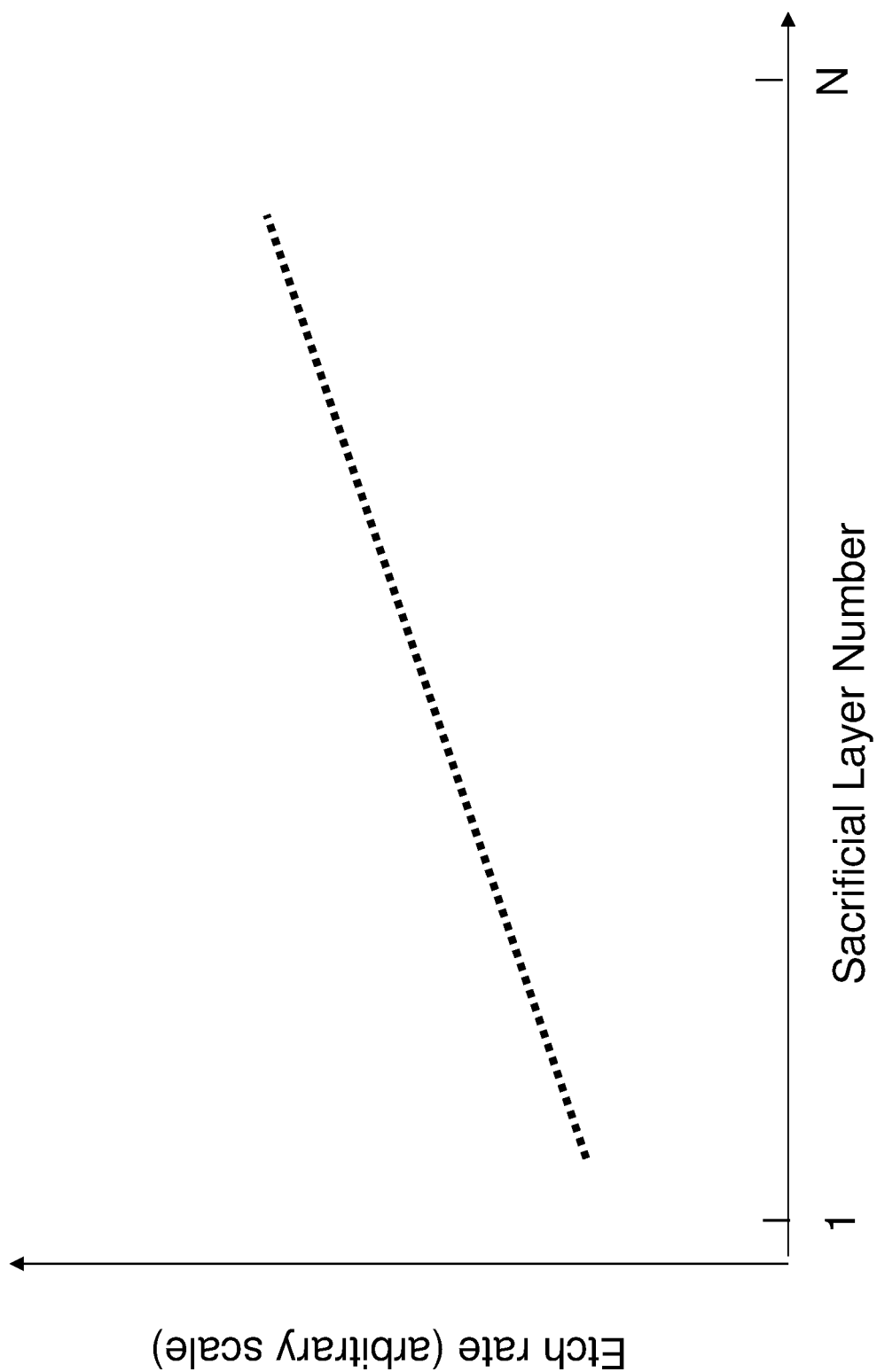
FIG. 2D is a graph illustrating the change in the etch rate in an isotropic etchant of the sacrificial material layers as a function of a sacrificial layer number as counted from bottom in a first exemplary configuration of the first exemplary structure according to an embodiment of the present disclosure.

In a first exemplary configuration of the first exemplary structure, the sacrificial material layers 42 can be numbered with positive integers starting with 1 in the order of proximity from the substrate (9, 10), and an overlying sacrificial material layer 42 can have a lower density and a higher etch rate in an isotropic etchant than an underlying sacrificial material layer 42 for each pair of sacrificial material layers 42 within the alternating stack (32, 42), as illustrated in FIGS. 2C and 2D.

Figure 2E:
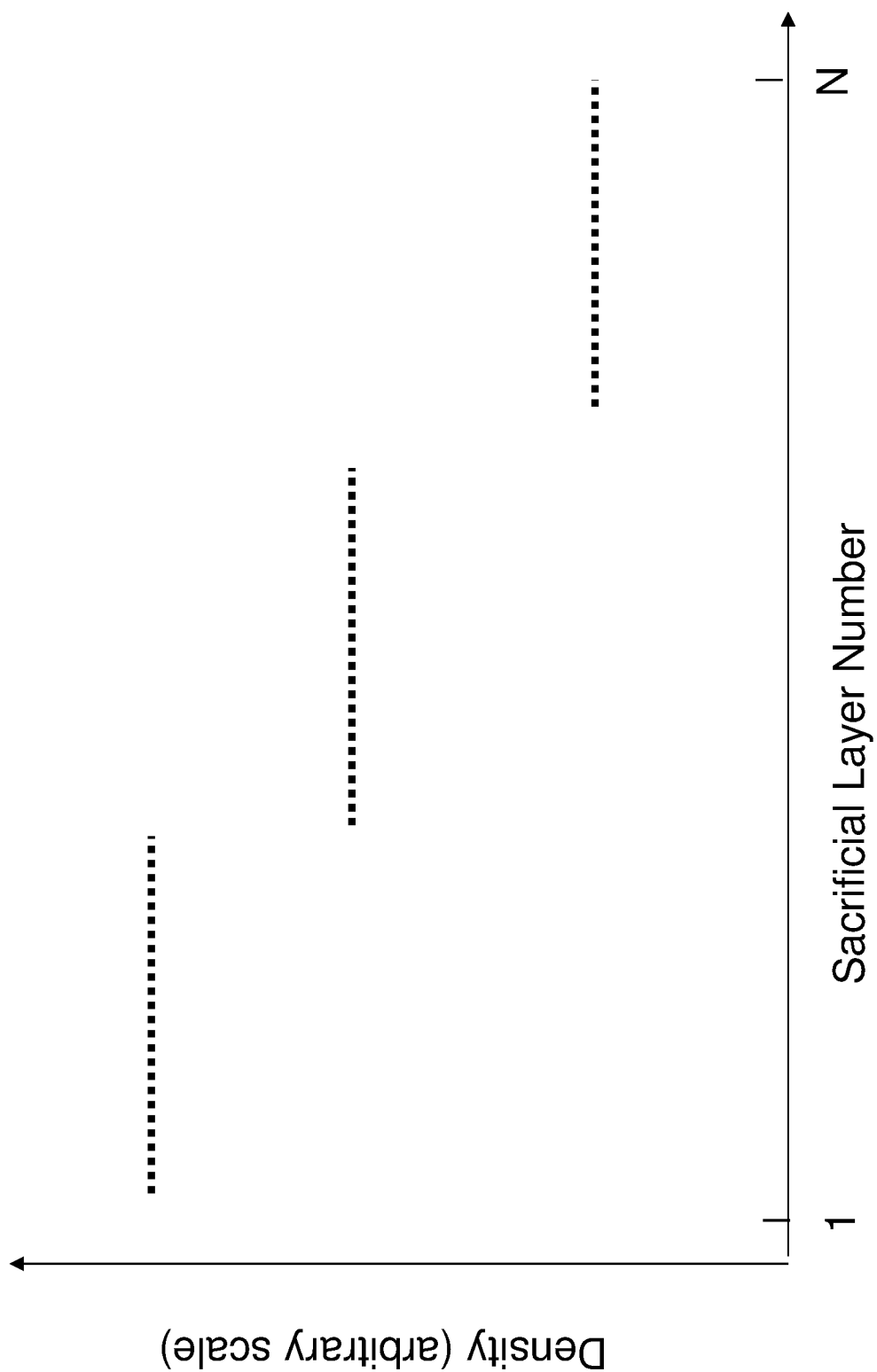
FIG. 2E is a graph illustrating the change in the density of the sacrificial material layers as a function of a sacrificial layer number as counted from bottom in the second exemplary configuration of the first exemplary structure according to an embodiment of the present disclosure.
Figure 2F:
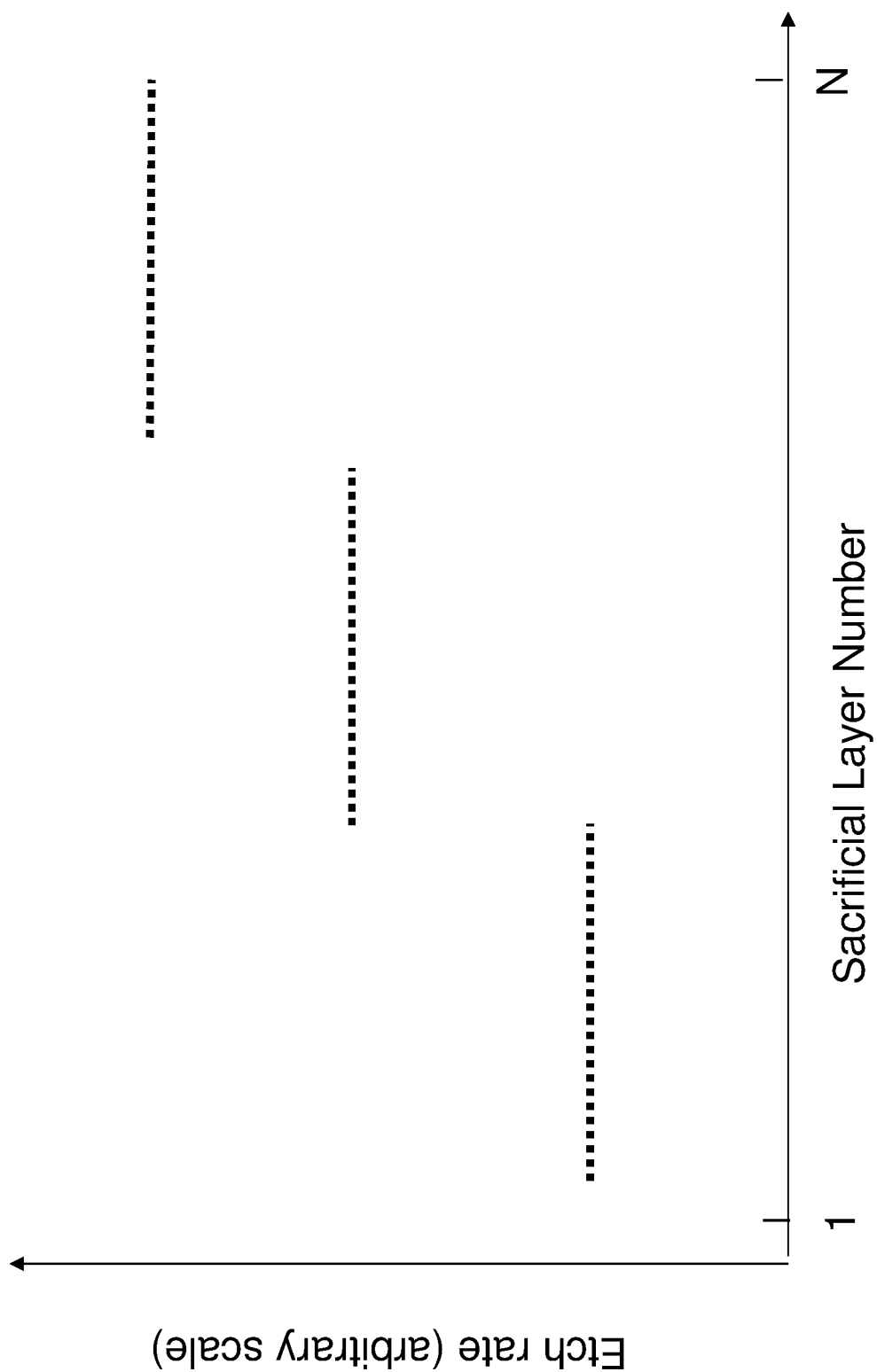
FIG. 2F is a graph illustrating the change in the etch rate in an isotropic etchant of the sacrificial material layers as a function of a sacrificial layer number as counted from bottom in a second exemplary configuration of the first exemplary structure according to an embodiment of the present disclosure.

In a second exemplary configuration of the first exemplary structure, the sacrificial material layers 42 can be numbered with positive integers starting with 1 in the order of proximity from the substrate (9, 10), and an overlying sacrificial material layer 42 can have a lower density than or have a same density as, and can have a lower etch rate in an isotropic etchant than or have a same etch rate in an isotropic etchant as, an underlying sacrificial material layer 42 for each pair of sacrificial material layers 42 within the alternating stack (32, 42), as illustrated in FIGS. 2E and 2F. The topmost sacrificial material layer 42 (i.e., the N-th sacrificial material layer 42) has a lower density and a higher etch rate in an isotropic etchant than the bottommost sacrificial material layer 42 (i.e., the first sacrificial material layer 42).

In an alternative embodiment, all sacrificial material layers 42 may have the same density and the same etch rate in an isotropic etchant. For example, all sacrificial material layers may comprise silicon nitride layers having the same density and the same etch rate in hot phosphoric acid.

In one embodiment, the insulating layers 32 can include a first silicon oxide material, and sacrificial material layers can include silicon nitride sacrificial material layers. The insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The sacrificial material layers 42 can be formed, for example, by plasma enhanced chemical vapor deposition (CVD) or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
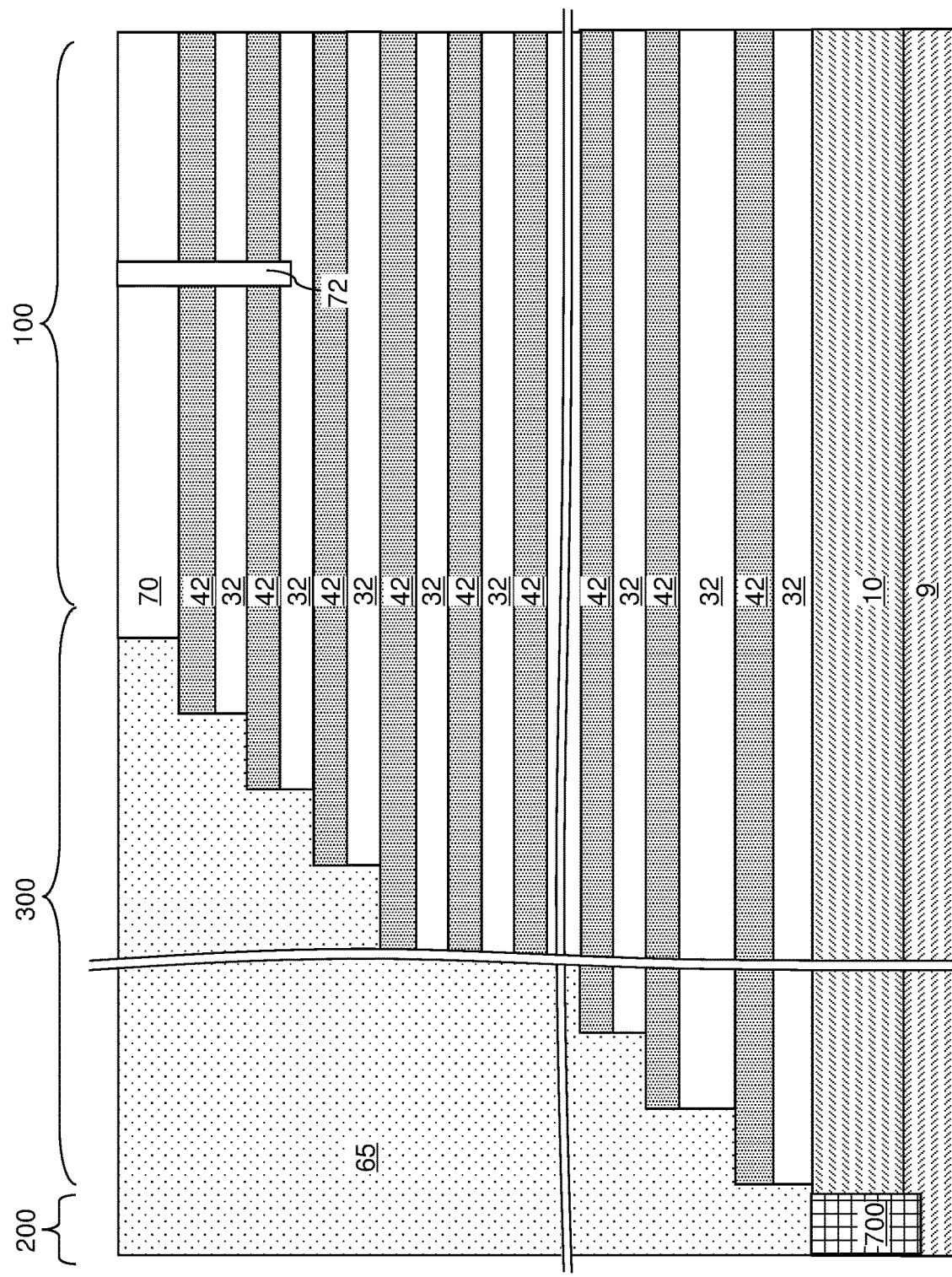
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. In one embodiment, the insulating layers 32 comprise a first silicon oxide material, and the retro-stepped dielectric material portion 65 comprises a second silicon oxide material.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
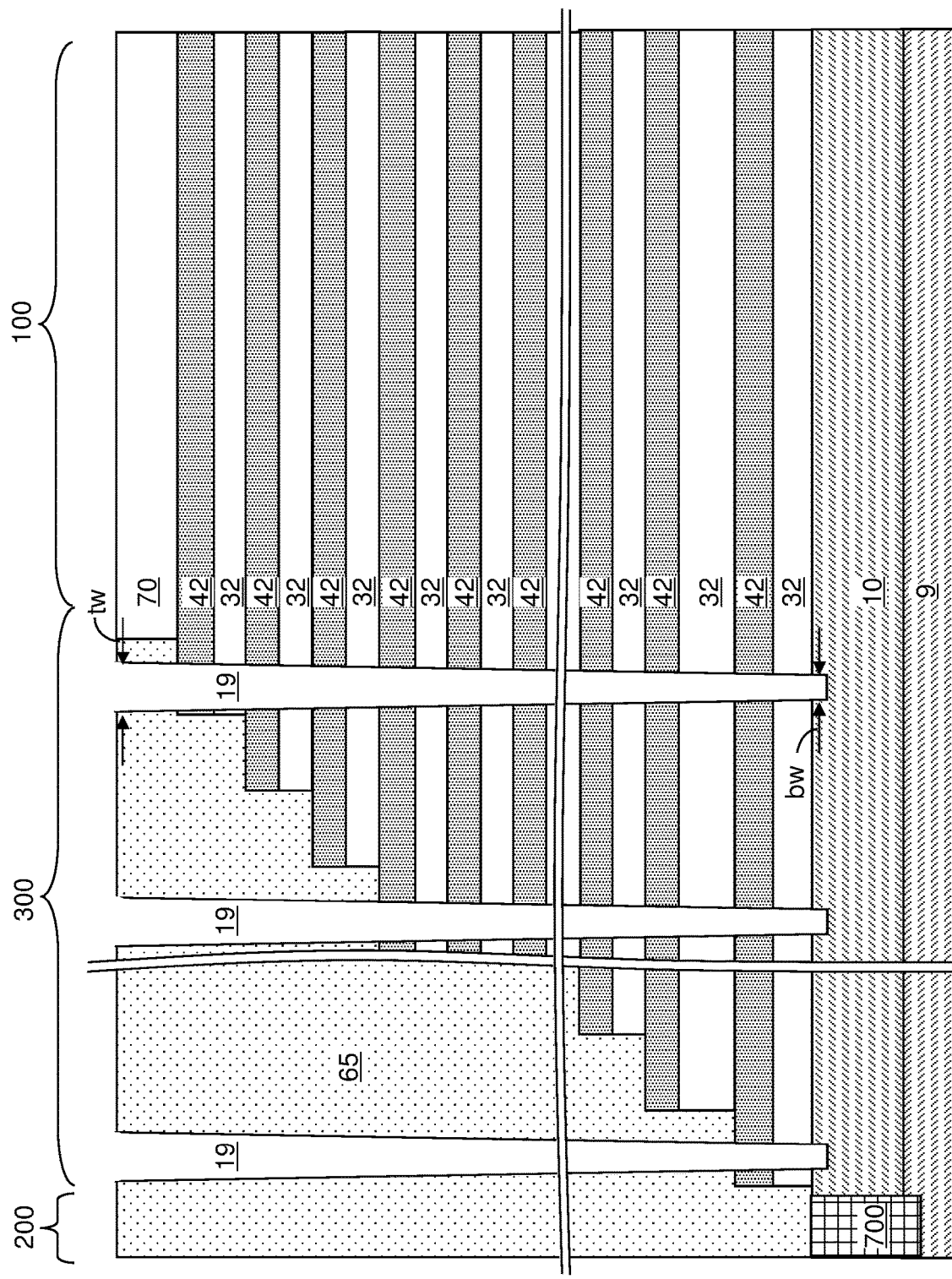
FIG. 4A is a schematic vertical cross-sectional view of the first exemplary structure after formation of support openings according to an embodiment of the present disclosure.
Figure 4B:
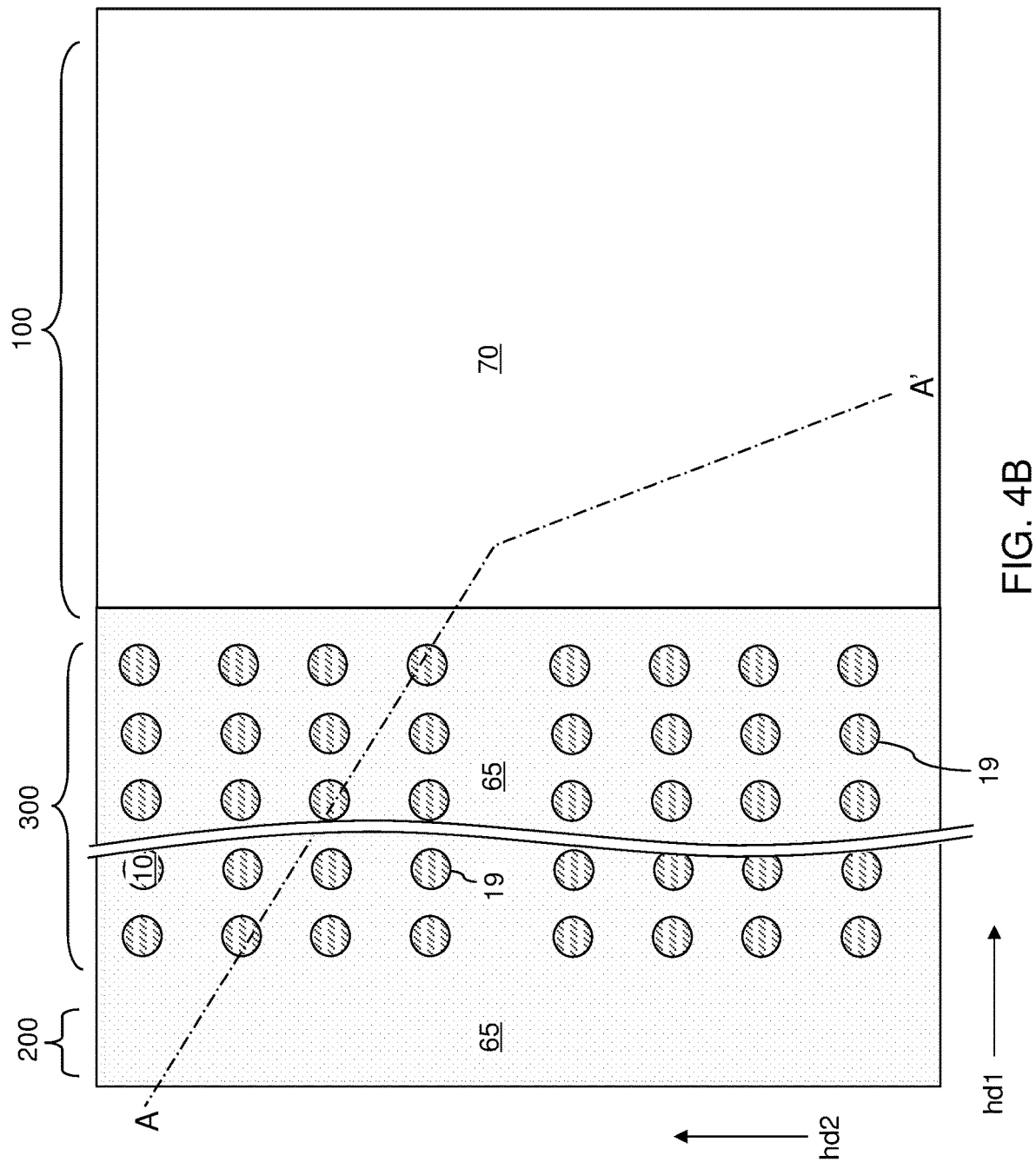
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings are formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form support openings 19. As used herein, a "support opening" refers to a structure in which a support structure (such as a support pillar structure) that mechanically supports other elements is subsequently formed. The support openings 19 are formed through the retro-stepped dielectric material portion 65 and the portion of the alternating stack (32, 42) that underlie the stepped surfaces in the contact region 300.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the support openings 19 can be substantially vertical, or can be tapered. In one embodiment, each of the support openings 19 can have a top periphery at a horizontal plane including a top surface of the retro-stepped dielectric material portion 65, and can have a bottom periphery that adjoins a bottom surface of the support opening 19. The maximum lateral dimension (i.e., the lateral dimension between a pair of points having a greatest lateral distance therebetween) of the top periphery of each support opening 19 can be a top width tw (which may be a diameter of the top periphery or a major axis of the top periphery), and the maximum lateral dimension of the bottom periphery of each support opening 19 can be a bottom width bw that is the same as or less than the top width tw. The patterned lithographic material stack can be subsequently removed, for example, by ashing.

Figure 5A:
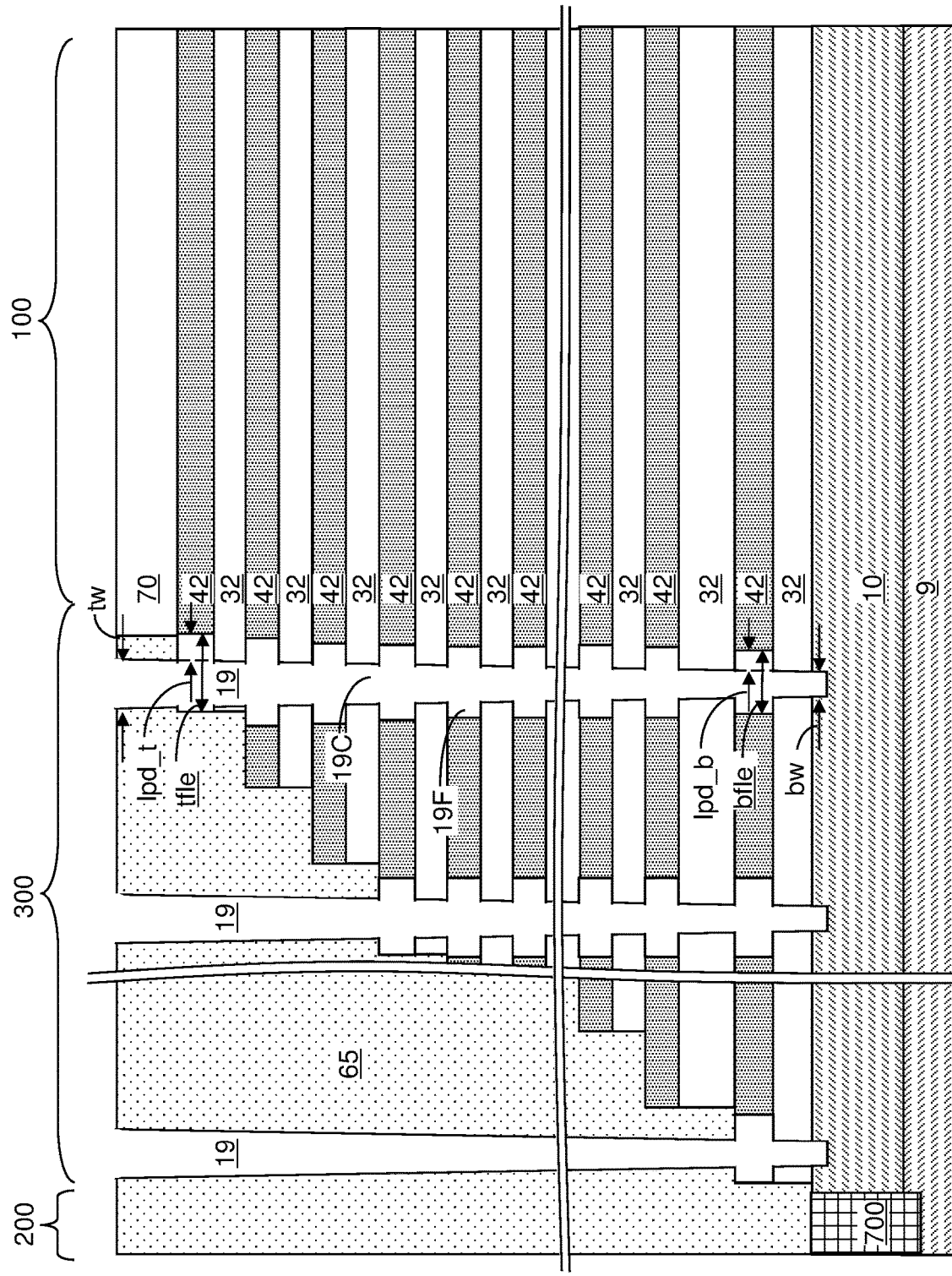
FIGS. 5A, 5B and 5C are schematic vertical cross-sectional view of the alternative configurations of the first exemplary structure after formation of fin cavities around the support openings according to an embodiment of the present disclosure.
Figure 5B:
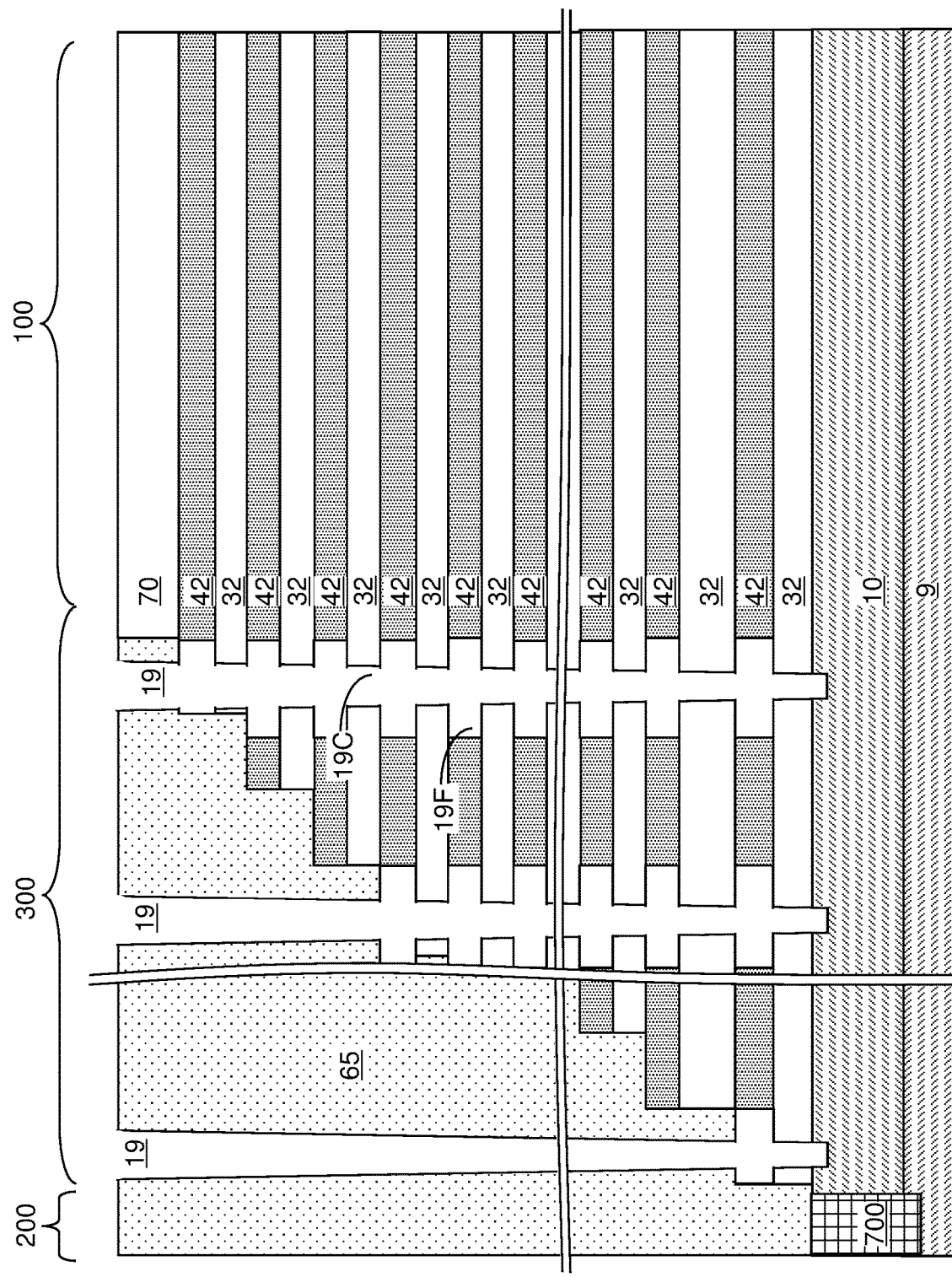
Figure 5C:
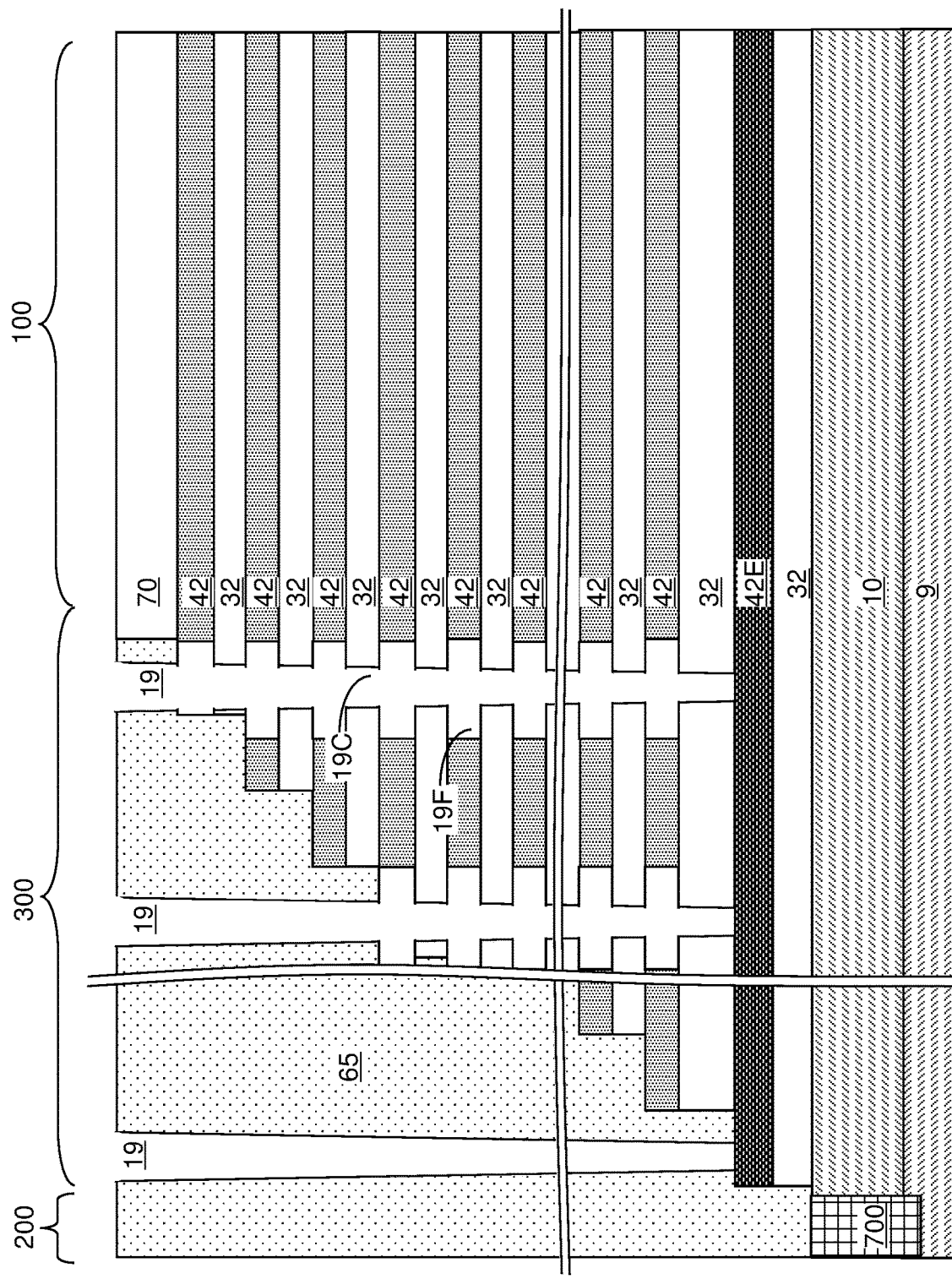

Referring to FIGS. 5A, 5B and 5C, fin cavities 19F can be formed at levels of the sacrificial material layers 42 around the support openings 19. Specifically, the sacrificial material layers 42 are laterally recessed selective to the insulating layers 32 around the support openings 19 by introducing an isotropic etchant that etches the sacrificial material layers 42 selective to the insulating layers 32. For example, if the insulating layers 32 comprise silicon oxide and if the sacrificial material layers 42 comprises silicon nitride, a wet etch process employing hot phosphoric acid can be employed as a selective isotropic etch process. The fin cavities 19F are formed in volumes from the sacrificial material layers 42 are etched. A subset of the fin cavities 19F that do not border the retro-stepped dielectric material portion 65 can have a respective cylindrical annular shape.

Each support opening 19 can include a columnar volume 19C that corresponds to the volume of the support opening 19 as formed at the processing steps of FIGS. 4A and 4B, and a set of at least one fin cavity 19F that is formed at the processing step of FIG. 5A, 5B or 5C, and laterally protrude from, and is adjoined to, the columnar volume 19F. In one embodiment, a subset of the support openings 19 may include a combination of a respective columnar volume 19C and a respective plurality of fin cavities 19F.

In one embodiment shown in FIG. 5A, the sacrificial material layers 42 have different etch rates. Specifically, the upper sacrificial material layers 42 have a higher etch rate than the lower sacrificial material layers 42. In this embodiment, a bottom lateral protrusion distance 1pd_b between the columnar volume 19C and a cylindrical sidewall of a bottommost fin cavity 19F is smaller than a top lateral protrusion distance 1pd_t between the columnar volume 19C and a cylindrical sidewall of a topmost fin cavity 19F cavities due to the differences in the etch rate of the sacrificial material layers 42. In other words, the fin cavities 19F in the lower sacrificial material layers 42 are wider in the horizontal direction (e.g., have a greater diameter) than the fin cavities 19F in the upper sacrificial material layers 42.

According to the embodiment of the present disclosure shown in FIG. 5A, a set of fin cavities 19F may have a variable lateral protrusion distance as measured between the columnar volume 19C and a cylindrical sidewall of a respective fin cavity 19F, and the variable lateral protrusion distance increases gradually with a vertical distance from the substrate (9, 10). In one embodiment, the variable lateral protrusion distance may decrease with a number associated with each of the sacrificial material layers 42 upon assigning each of the sacrificial material layers 42 with sequentially increasing integers beginning with 1 and incrementing by 1 in the order of proximity from the substrate (9, 10). In another embodiment, the set of fin cavities 19F may have a variable lateral protrusion distance as measured between the columnar volume 19C and a cylindrical sidewall of a respective fin cavity, and the variable lateral protrusion distance increases stepwise with a vertical distance from the substrate (9, 10). In one embodiment, a bottommost fin cavity 19F has a bottom fin lateral extent bfle that is a maximum lateral dimension within the bottommost fin cavity 19F, a topmost fin cavity 19F has a top fin lateral extent tfle that is a maximum lateral dimension within the topmost fin cavity. The bottommost fin lateral extent bfle may be smaller than the topmost fin lateral extent tfle.

In an alternative embodiment shown in FIG. 5B, all sacrificial material layers 42 have the same etch rate and the same density. In this embodiment, all fin cavities 19F have the same lateral protrusion distance between the columnar volume 19C and a cylindrical sidewall of each fin cavity 19F, and the same fin lateral extent.

In another alternative embodiment shown in FIG. 5C, the bottommost sacrificial material layer 42E may have a different composition from the other sacrificial material layers 42. In this embodiment, the bottommost sacrificial material layer 42E acts as an etch stop during the etching of the support openings 19 at the step shown in FIGS. 4A and 4B. In this embodiment, the support openings 19 do not extend through the bottommost sacrificial material layer 42E, and terminate above the bottom surface of the bottommost sacrificial material layer 42E.

In one embodiment shown in FIGS. 5A-5C, the columnar volume 19C may have a variable lateral extent such that a topmost portion of the columnar volume that is not adjoined to any fin cavity 19F has a greater width (such as the top width tw) than a bottommost portion of the columnar volume that 19F is not adjoined to any fin cavity 19F (such as the bottom width bw).

Generally, a first region, such as the memory array region 100 of the alternating stack (32, 42), includes all layers of the alternating stack (32, 42), and can be free of memory openings 19. A second region, such as the contact region 300, of the alternating stack (32, 42) includes stepped surfaces of the alternating stack (32, 42), and is referred to as staircase region. The support openings 19 can be formed in the staircase region. Lateral extents of the sacrificial material layers 42 decrease with a vertical distance from the substrate (9, 10). The retro-stepped dielectric material portion 65 overlies the stepped surfaces, and the support openings 19 vertically extend through the retro-stepped dielectric material portion 65. A total number of fin cavities per support opening 19 may differ among the support openings 19.

Figure 6A:
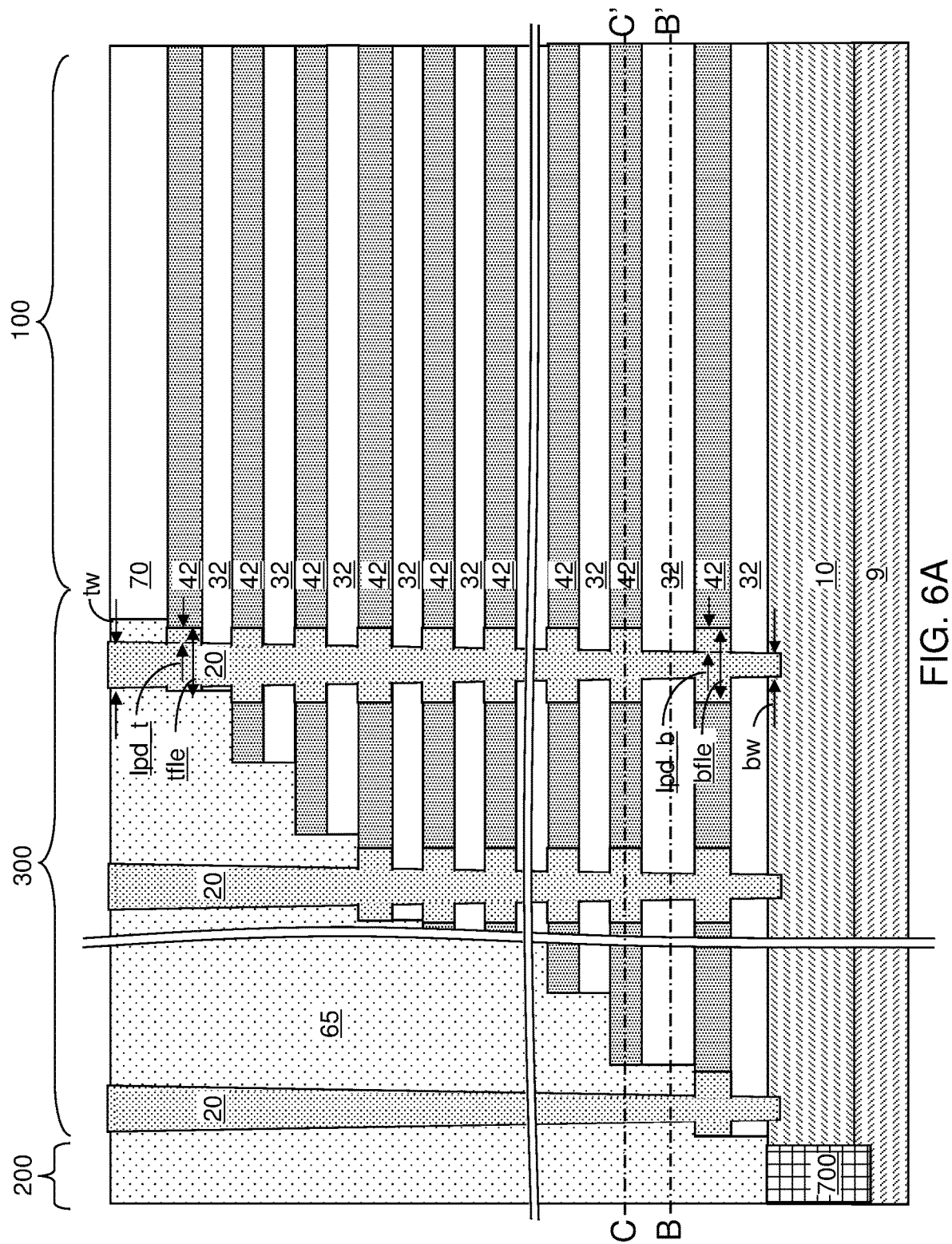
FIG. 6A is a schematic vertical cross-sectional view of the first exemplary structure after formation of support pillar structures according to an embodiment of the present disclosure.
Figure 6B:
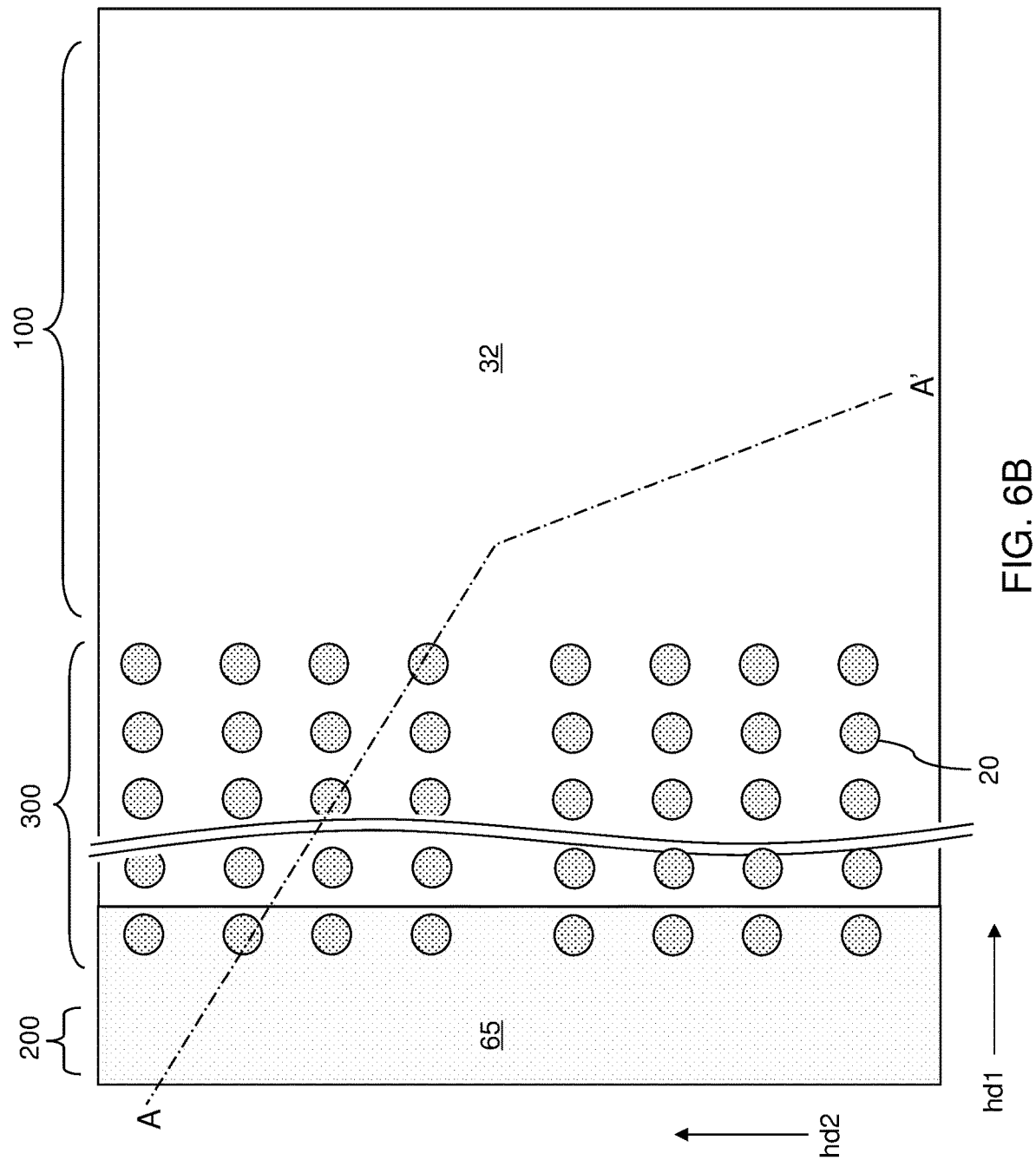
FIG. 6B is a horizontal cross-sectional view along the horizontal plane B-B' of the first exemplary structure of FIG. 6A. The vertical plane A-A' is the plane of the cross-section for FIG. 6A.

Referring to FIGS. 6A-6C, at least one fill material can be deposited in volumes of the support openings 19 (including the volumes of the fin cavities 19F) by a conformal deposition process such as a chemical vapor deposition (CVD) process. In one embodiment, the at least one fill material may include, and/or may consist essentially of, a dielectric fill material, such as silicon oxide. In one embodiment, low pressure chemical vapor deposition may be employed to deposit a silicon oxide material derived from thermal decomposition of tetraethylorthosilicate (TEOS). In an alternative embodiment, the at least one fill material may include plural dielectric fill materials, at least one of which may comprise a metal oxide dielectric fill material, such as aluminum oxide, hafnium oxide, tantalum oxide, etc. For example, the at least one fill material may include a two layer stack of silicon oxide layer and a metal oxide dielectric material layer, or a three layer stack of a first silicon oxide layer, a metal oxide dielectric material layer, and a second silicon oxide layer. The first silicon oxide layer may be deposited conformally on the sidewalls of the support openings 19 (including the volumes of the fin cavities 19F), the metal oxide dielectric material layer may then be deposited conformally on the first silicon oxide located in the support openings 19 (and optionally in the volumes of the fin cavities 19F if they are not completely filled with the first silicon oxide layer), and the second silicon oxide layer may then be deposited on the metal oxide dielectric material layer to fill the remaining volumes of the support openings 19. Excess portions of the at least one fill material can be removed from above the horizontal plane including the top surface of the retro-stepped dielectric material portion 65. Remaining portions of the at least one fill material in each support opening 19 comprise an array of support pillar structures 20, which can be located in the contact region 300.

In one embodiment, each of the support pillar structures 20 comprises a central columnar structure 21 (which may be a central dielectric columnar structure) and a set of fins 22 (which may be a set of dielectric fins) laterally protruding from the central columnar structure 21 at levels of a subset of a respective subset of the sacrificial material layers 42. In one embodiment, the insulating layers 32 comprise, and/or consist essentially of, a first silicon oxide material, the retro-stepped dielectric material portion comprises, and/or consist essentially of, a second silicon oxide material, and the at least one fill material deposited in the support openings and the fin cavities comprises, and/or consist essentially of, a third silicon oxide material. The first, second and third silicon oxide materials may have the same composition or different compositions.

If the support openings 19 of the embodiment of FIG. 5A are used, then a bottom lateral protrusion distance lpd_b between the central columnar structure 21 and a cylindrical sidewall of a bottommost fin of the set of fins 22 may be smaller than a top lateral protrusion distance lpd_t between the central columnar structure 21 and a cylindrical sidewall of a topmost fin of the set of fins 22 due to the differences in the lateral recess distances of the sacrificial material layers 42. The set of fins 22 may have a variable lateral protrusion distance as measured between the central columnar structure 21 and a cylindrical sidewall of a respective fin 22, and the variable lateral protrusion distance increases gradually with a vertical distance from the substrate (9, 10).

Alternatively, the set of fins 22 has a variable lateral protrusion distance as measured between the central columnar structure 21 and a cylindrical sidewall of a respective fin, and the variable lateral protrusion distance increases stepwise with a vertical distance from the substrate (9, 10).

In one embodiment, a bottommost fin within the set of fins 22 has a bottom fin lateral extent bfle that is a maximum lateral dimension within the bottommost fin, a topmost fin within the set of fins 22 has a top fin lateral extent tfle that is a maximum lateral dimension with the topmost fin, and the bottommost fin lateral extent bfle is smaller than the topmost fin lateral extent tfle.

Since the lower sacrificial material layers 42 extend into the end portion of the staircase which contains less total layers (32, 42) of the stack, the compressive stress may be lower on the lower sacrificial material layers 42 than on the upper sacrificial material layers 42 which are located only in the leading portion of the staircase which contains more total layers (32, 42). Therefore, the bottommost fin lateral extent in the lower portion of the stack may be smaller than the topmost fin lateral extent since due to the smaller number of total layers at the end of the staircase. The smaller fin lateral extent permits more conductive material to be filled in the backside recesses in the steps described with respect to FIGS. 11 and 12A-12D below. The additional metal reduces the word line resistance.

In contrast, if the support openings 19 of FIG. 5B are used, then the lateral protrusion distance between the central columnar structure 21 and a cylindrical sidewall of each of the fins 22 can be the same. Furthermore, all fins 22 have the same fin lateral extent.

In one embodiment, the central columnar structure 21 has a variable lateral extent such that a topmost portion of the central columnar structure 21 that is not adjoined to any fin within the set of fins 22 has a greater width (such as the top width tw) than a bottommost portion of the central columnar structure that is not adjoined to any fin within the set of fins 22 (which has the bottom width bw).

In one embodiment, each layer within the alternating stack (32, 42) is present within a first region, such as a memory array region 100. In one embodiment, a second region that is located outside the first region, such as the contact region 300, comprises a staircase region in which lateral extents of the sacrificial material layers 42 decrease with a vertical distance from the substrate such that the alternating stack (32, 42) comprises stepped surfaces. A retro-stepped dielectric material portion 65 overlies the stepped surfaces, and the support pillar structure 20 vertically extends through the retro-stepped dielectric material portion 65. The support pillar structures 20 can consist essentially of at least one dielectric material, such as silicon oxide or a dielectric metal oxide. In this case, the support pillar structures 20 can be dielectric pillar structures.

A plurality of support pillar structures 20 can be provided as at least one array of support pillar structures 20. Each of the support pillar structures 20 vertically extends through the second region of the alternating stack (32, 42), and comprises a respective central columnar structure 21 and a respective set of fins 22 that laterally protrude from the respective central columnar structure 21 at levels of a respective subset of the sacrificial material layers 42. A total number of fins 22 per support pillar structure 20 differs for at least one pair of support pillar structures 20 among the support pillar structures 20.

Figure 7A:
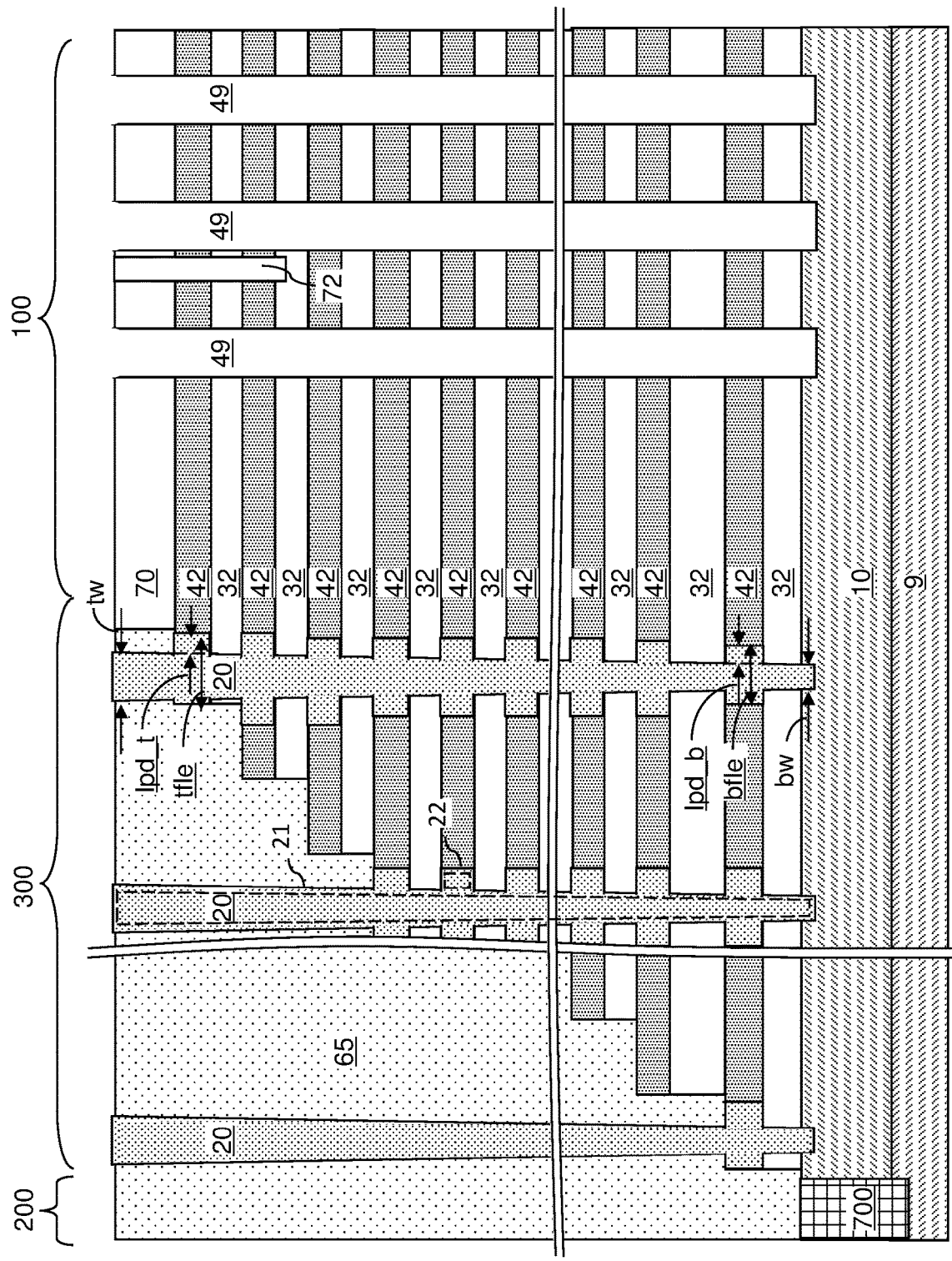
FIG. 7A is a schematic vertical cross-sectional view of the first exemplary structure after formation of memory openings according to an embodiment of the present disclosure.
Figure 7B:
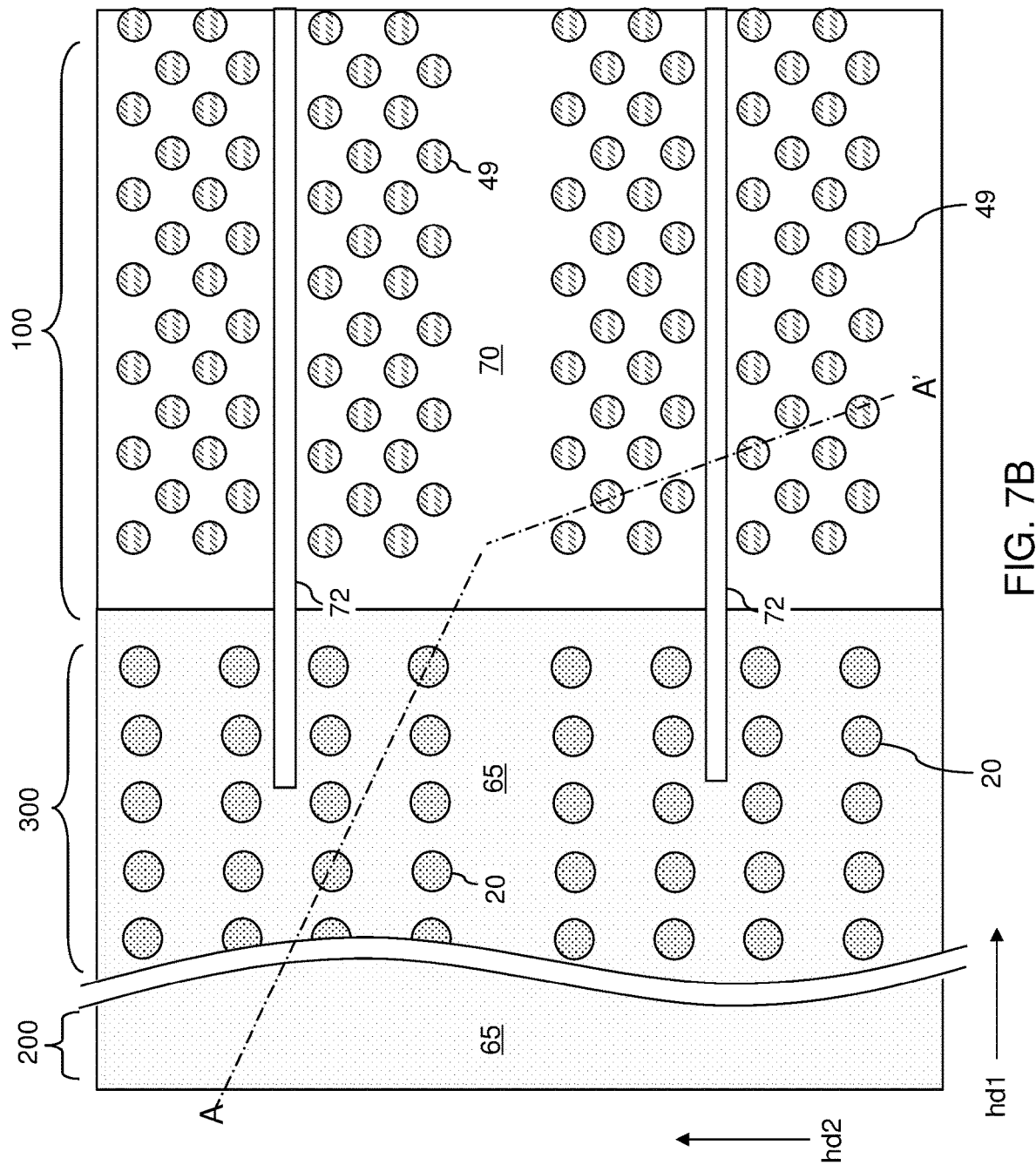
FIG. 7B is a top-down view of the first exemplary structure of FIG. 7A. The vertical plane A-A' is the plane of the cross-section for FIG. 7A.

Referring to FIGS. 7A and 7B, a lithographic material stack (not shown) including at least a photoresist layer can be formed over the insulating cap layer 70 and the retro-stepped dielectric material portion 65, and can be lithographically patterned to form openings therein. The openings include a set of openings formed over the memory array region 100. The pattern in the lithographic material stack can be transferred through the insulating cap layer 70 and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. As used herein, a "memory opening" refers to a structure in which memory elements, such as a memory stack structure, is subsequently formed. The memory openings 49 are formed through the insulating cap layer 70 and the entirety of the alternating stack (32, 42) in the memory array region 100.

The memory openings 49 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 can be coplanar with the topmost surface of the semiconductor material layer 10.

Each of the memory openings 49 may include a sidewall (or a plurality of sidewalls) that extends substantially perpendicular to the topmost surface of the substrate. A two-dimensional array of memory openings 49 can be formed in the memory array region 100. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

FIGS. 8A-8H illustrate structural changes in a memory opening 49, which is one of the memory openings 49 in the first exemplary structure of FIGS. 7A and 7B.

Referring to FIG. 8A, a memory opening 49 in the exemplary device structure of FIGS. 7A and 7B is illustrated. The memory opening 49 extends through the insulating cap layer 70, the alternating stack (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 8B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer.

The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 8D:
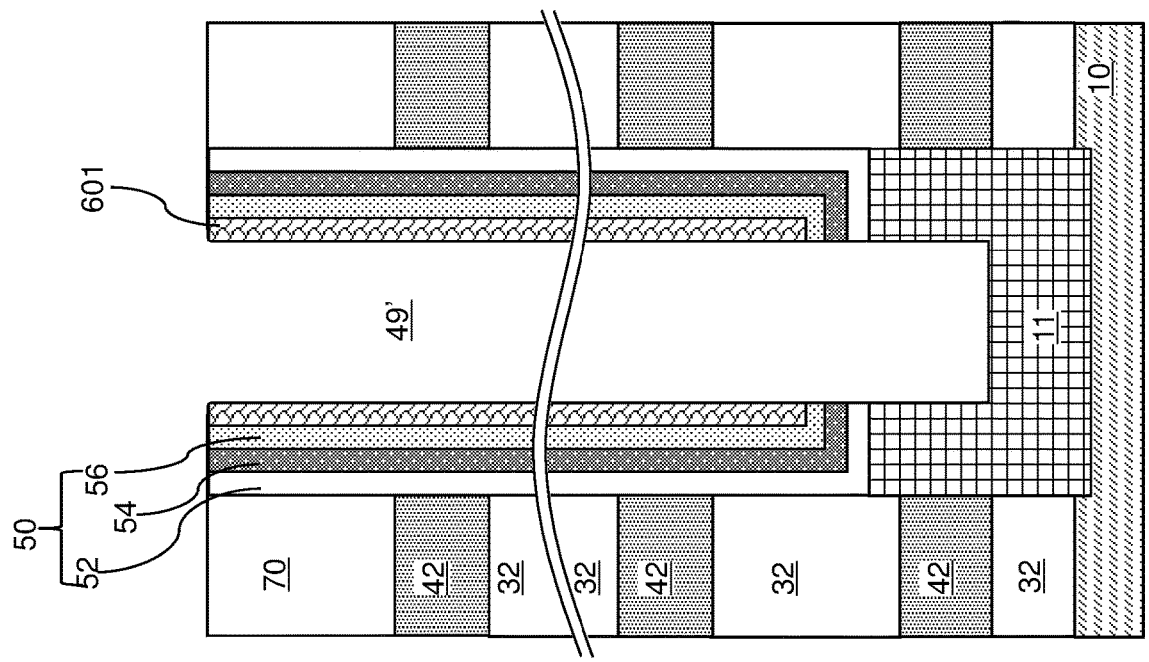
Figure 8C:
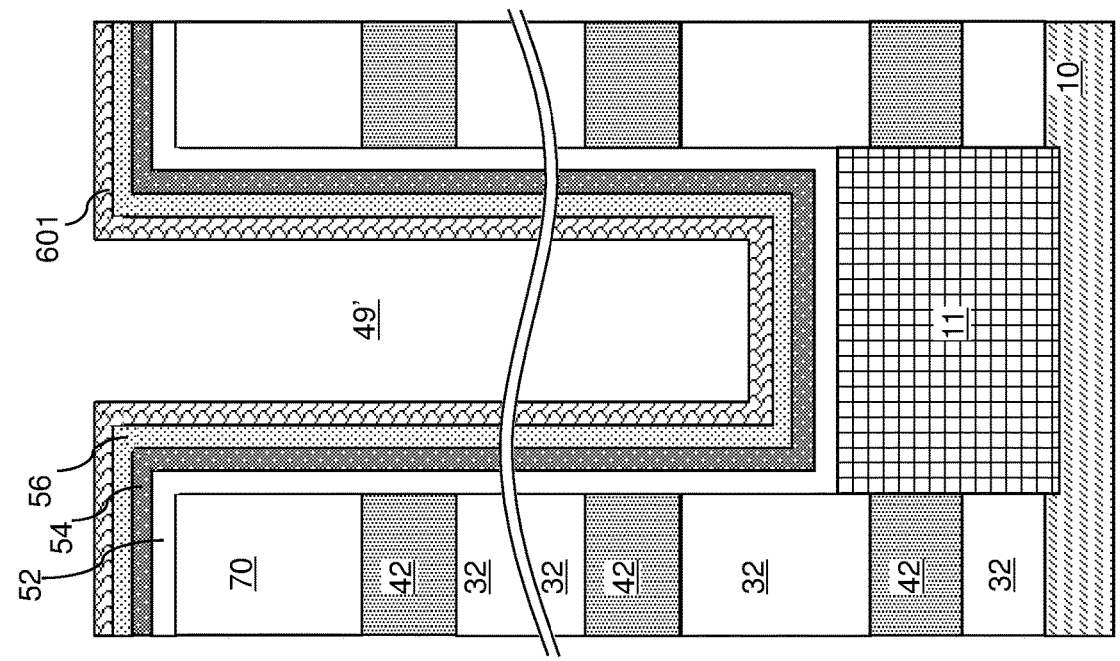

Referring to FIG. 8C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen.

The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, or a ferroelectric material that can store information in the form of a ferroelectric polarization direction, or any other memory material that can store date by altering electrical resistivity.

The memory material layer 54 can be formed as a single memory material layer of homogeneous composition, or can include a stack of multiple memory material layers. In one embodiment, the memory material layer 54 may comprise an insulating charge trapping material, such as a continuous silicon nitride layer or discrete silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, if the memory material layer 54 comprises a charge storage material, then the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 8D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, or a resistive memory material that can provide at least two different levels of resistivity (such as a phase change material), or any other memory material that can store information by a change in state. In one embodiment, each memory material layer 54 can include a vertical stack of charge storage regions (e.g., portions of a silicon nitride memory material layer) that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (as embodied as the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Figure 8E:
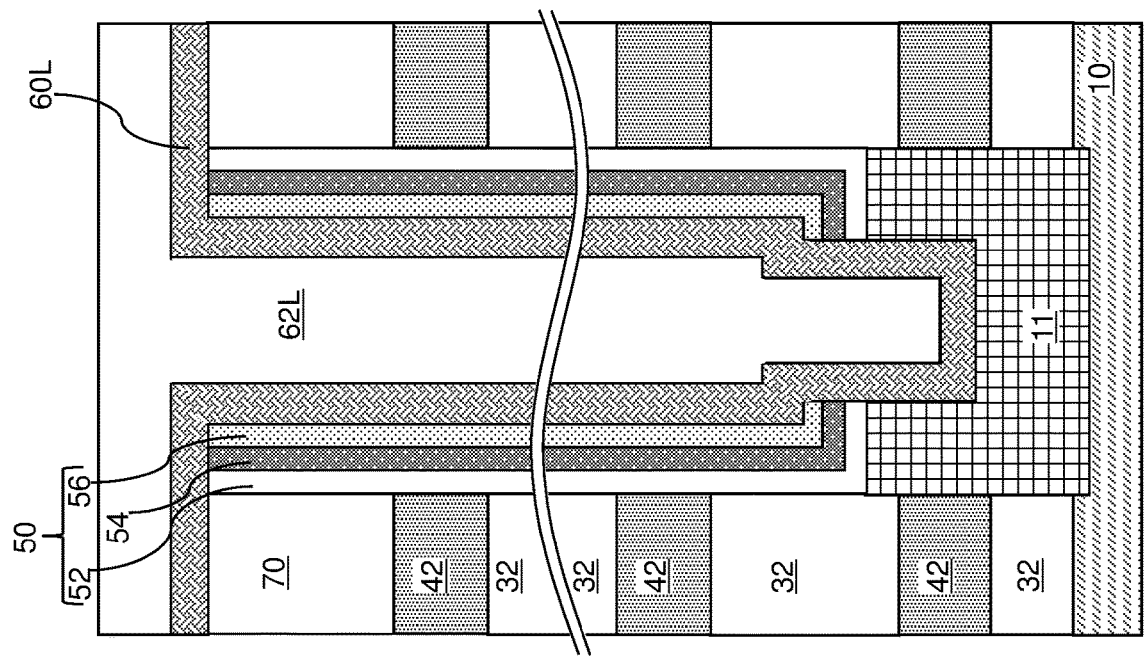

Referring to FIG. 8E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Figure 8F:
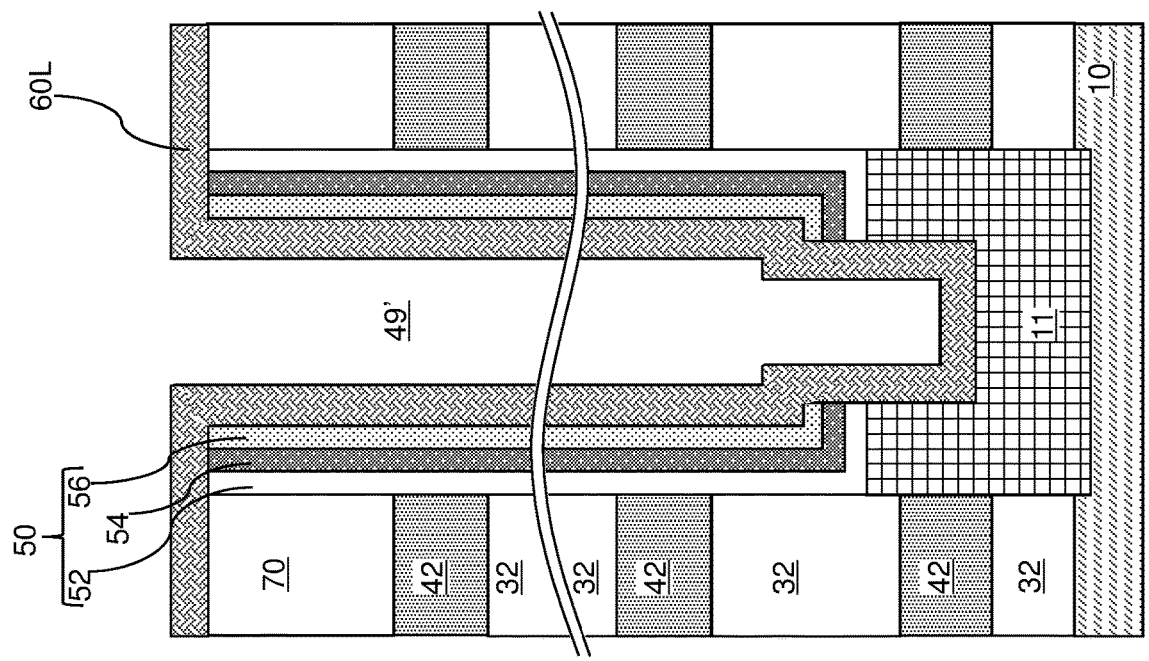

Referring to FIG. 8F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 8G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 8H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements as embodied as portions of the memory material layer 54, and an optional blocking dielectric layer 52. An entire set of material portions (e.g., pedestal channel portion 11 (if present), a memory stack structure 55, a dielectric core 62, and a drain region 63) that fills a memory opening 49 is herein referred to as a memory opening fill structure 58.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

Figure 9:
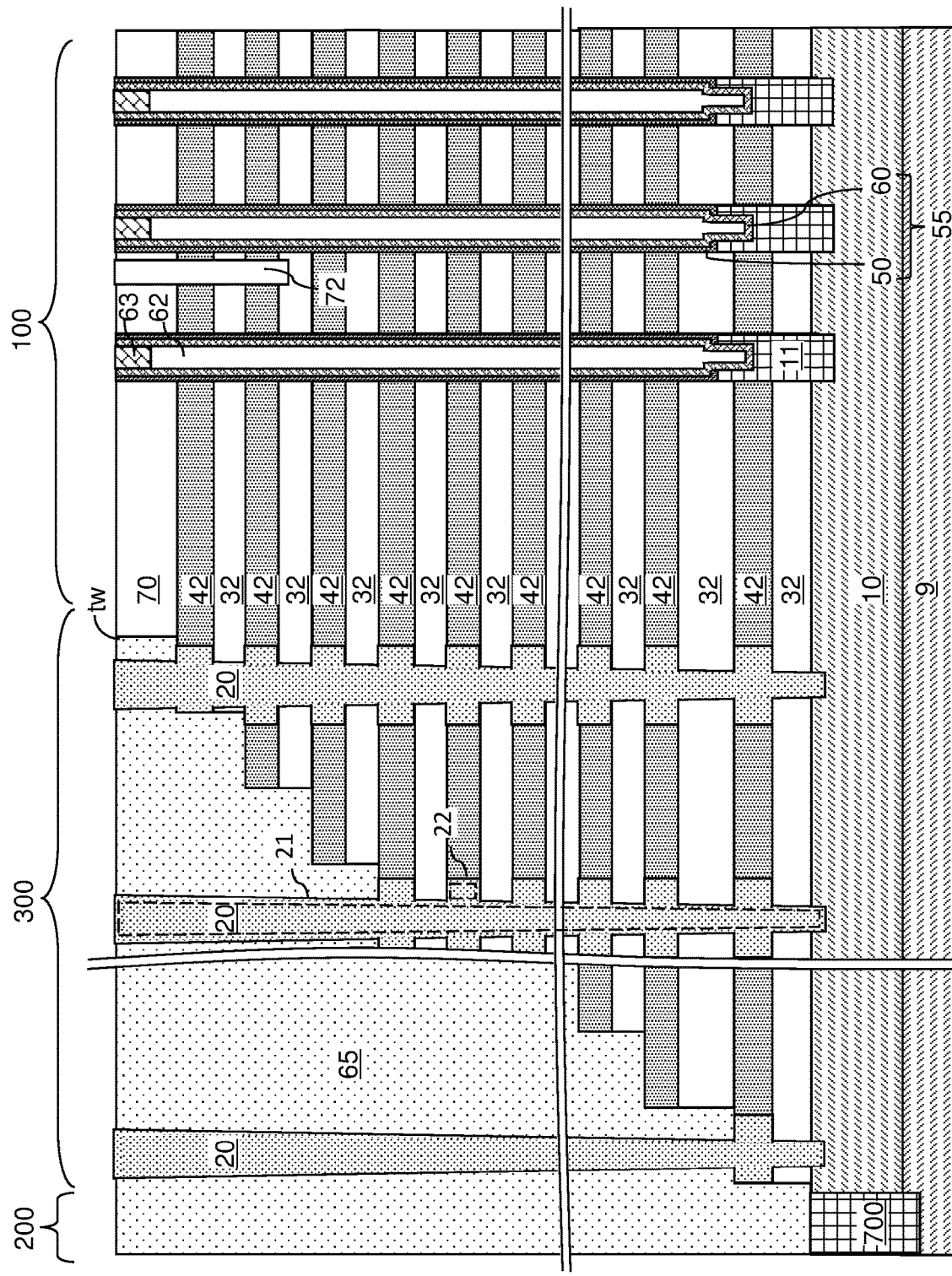
FIG. 9 is a schematic vertical cross-sectional view of the first exemplary structure after formation of memory stack structures and support pillar structures according to an embodiment of the present disclosure.

Referring to FIG. 9, the first exemplary structure is illustrated after formation of memory opening fill structures 58. An instance of a memory opening fill structure 58 can be formed within each memory opening 49 of the structure of FIGS. 7A and 7B.

In an alternative embodiment, the memory openings 49 and the support openings 19 may be filled with the memory openings fill structures 58 and support pillar structures 20, respectively, during the same deposition steps shown in FIGS. 8A-8H. In this alternative embodiment, the step of forming the dielectric support pillar structures 20 shown in FIGS. 6A and 6B is omitted. The support pillar structures 20 and the memory opening fill structures 58 contain the same layers and regions (i.e., 50, 60 and 63). However, the support pillar structures 20 include fins 22, while the memory opening fill structures 58 do not include fins 22. Furthermore, the drain regions 63 of the memory opening fill structures 58 is electrically connected to bit lines, while the support pillar structures 20 include dummy drain regions 63 which are not electrically connected to the bit lines.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (as embodied as memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 10A:
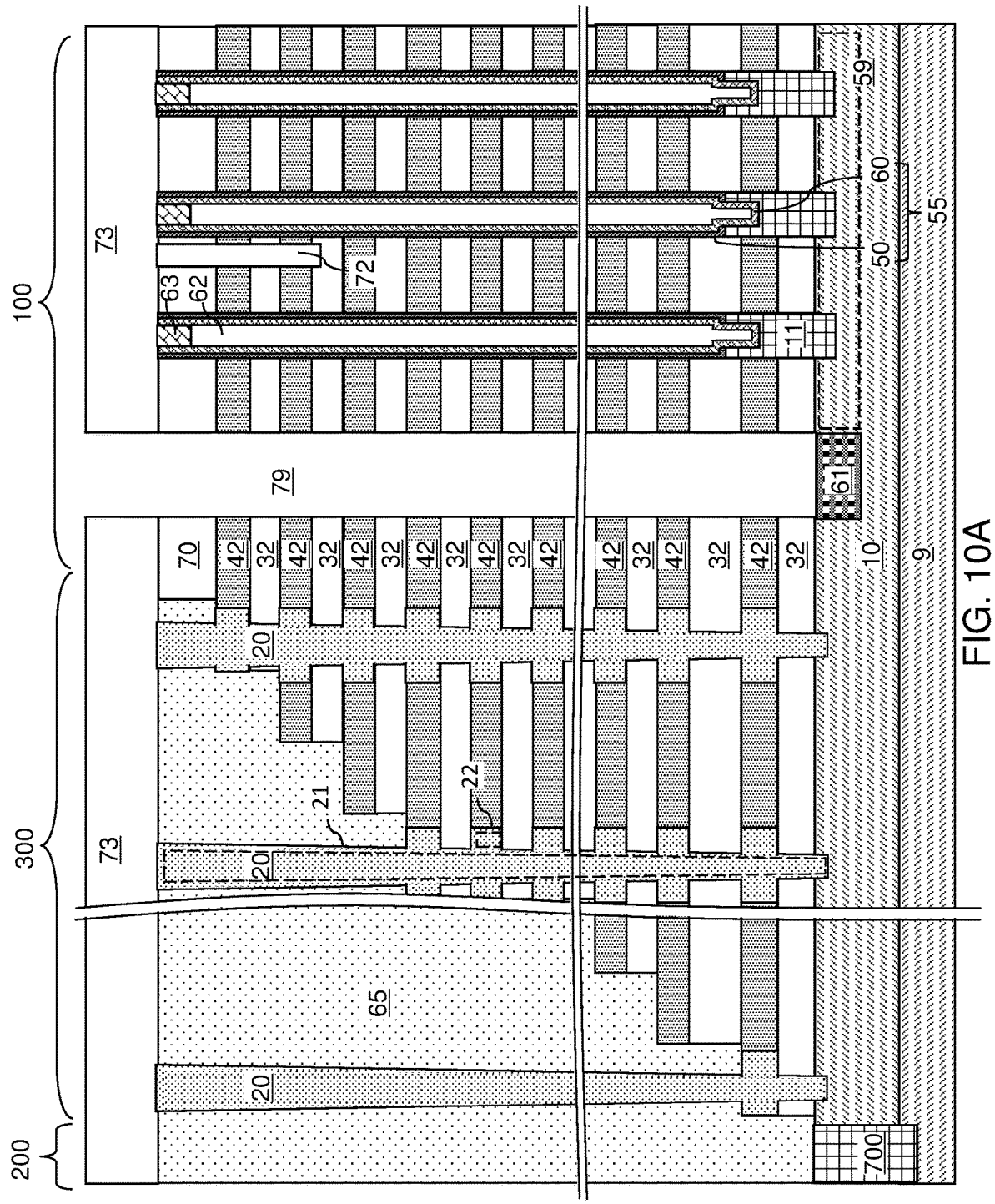
FIG. 10A is a schematic vertical cross-sectional view of the first exemplary structure after formation of backside trenches according to an embodiment of the present disclosure.
Figure 10B:
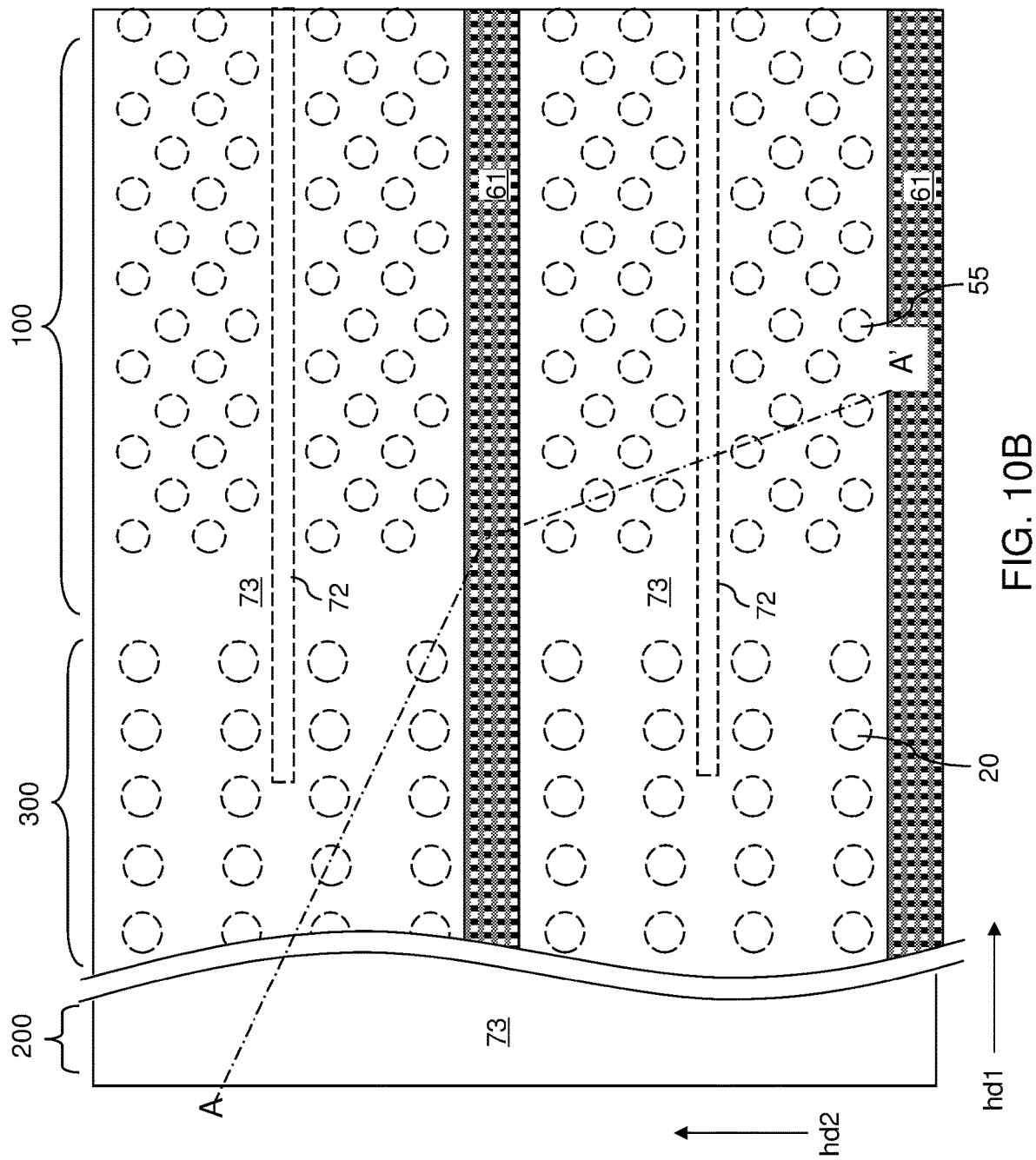
FIG. 10B is a partial see-through top-down view of the first exemplary structure of FIG. 10A. The vertical plane A-A' is the plane of the schematic vertical cross-sectional view of FIG. 10A.

Referring to FIGS. 10A and 10B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed.

A source region 61 can be formed at a surface portion of the semiconductor material layer 10 under each backside cavity 79' by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. The photoresist layer can be removed, for example, by ashing.

Figure 11:
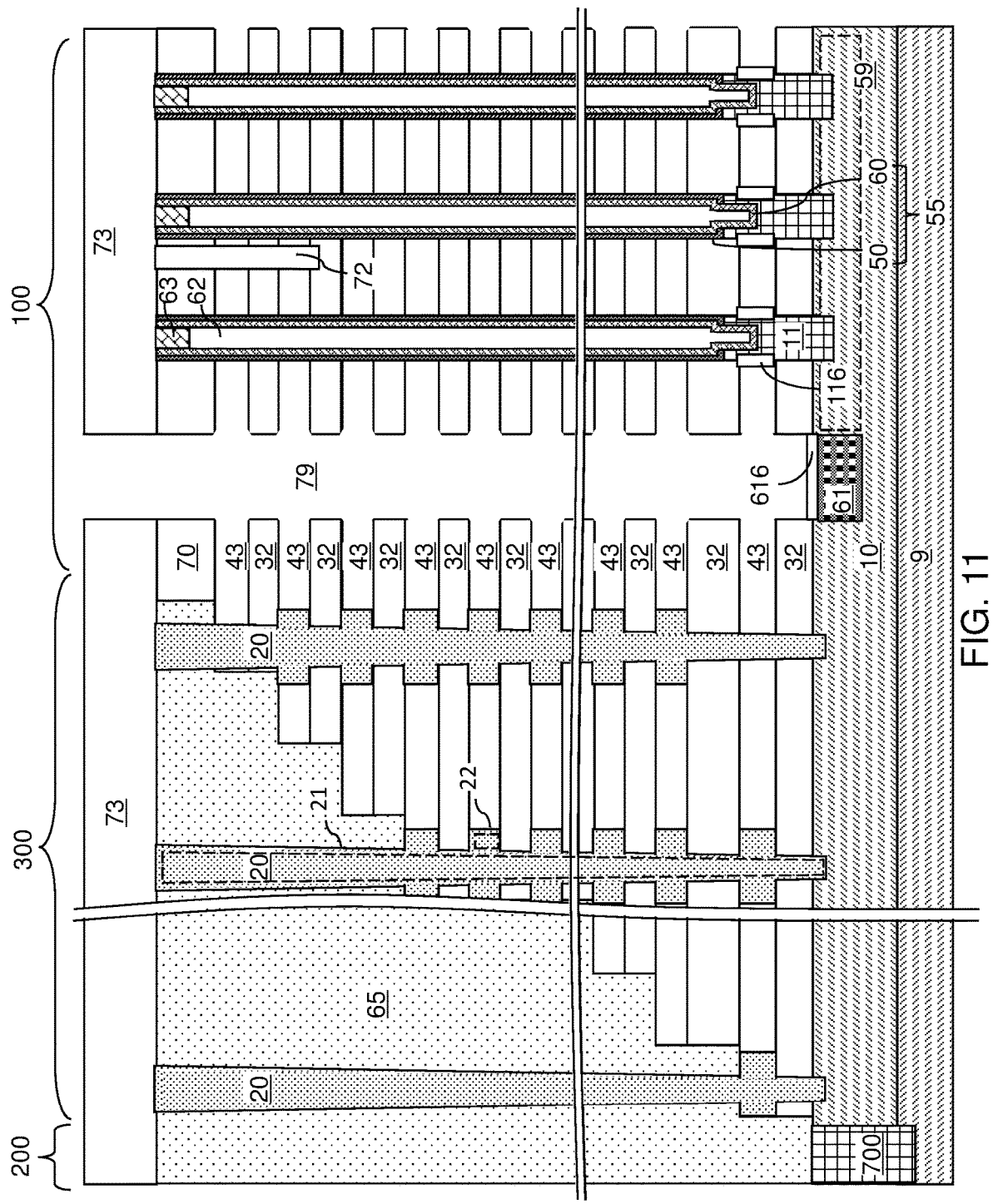
FIG. 11 is a schematic vertical cross-sectional view of the first exemplary structure after formation of backside recesses according to an embodiment of the present disclosure.
Figure 12A:
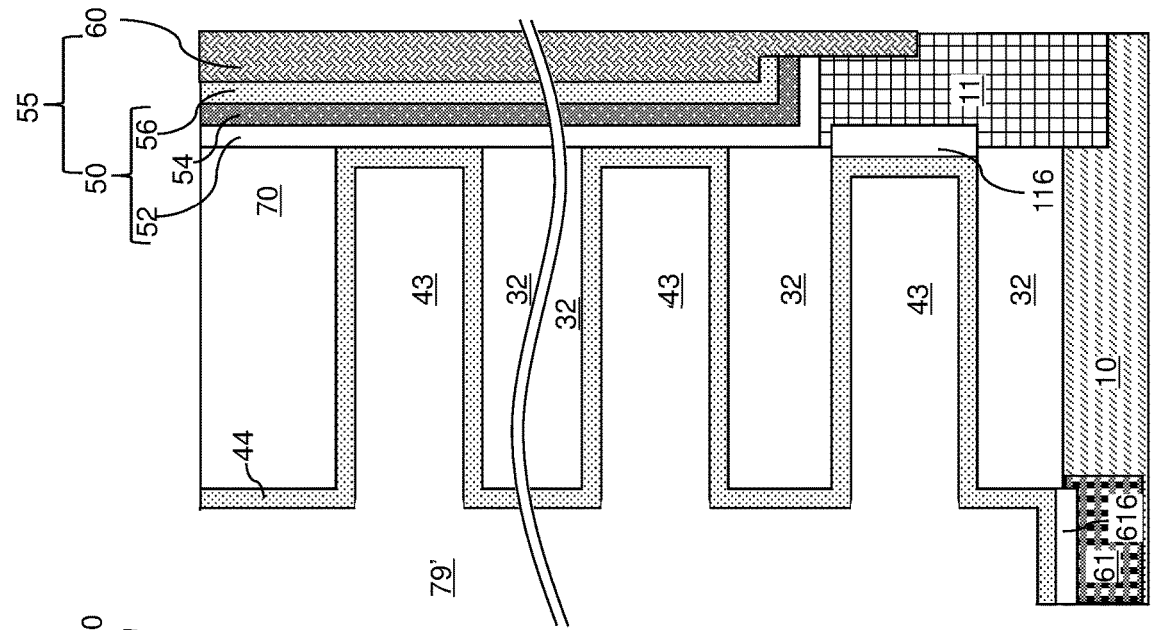

Referring to FIGS. 11 and 12A, an isotropic etchant that selectively etches the second material of the sacrificial material layers 42 with respect to the first material of the insulating layers 32 can be introduced into the backside trenches 79, for example, employing an isotropic etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides. Cylindrical surfaces of the fins 22 of the support pillar structures 20 and cylindrical surface segments of the memory opening fill structures 58 are physically exposed to the backside recesses 43.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 12B:
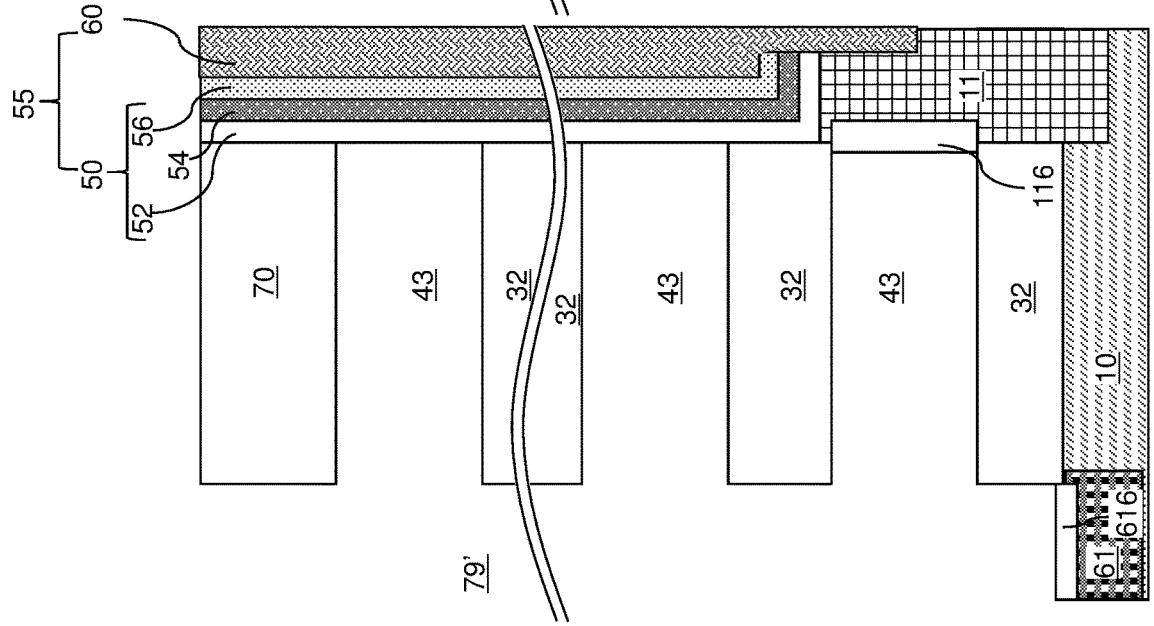

Referring to FIG. 12B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 12C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 13:
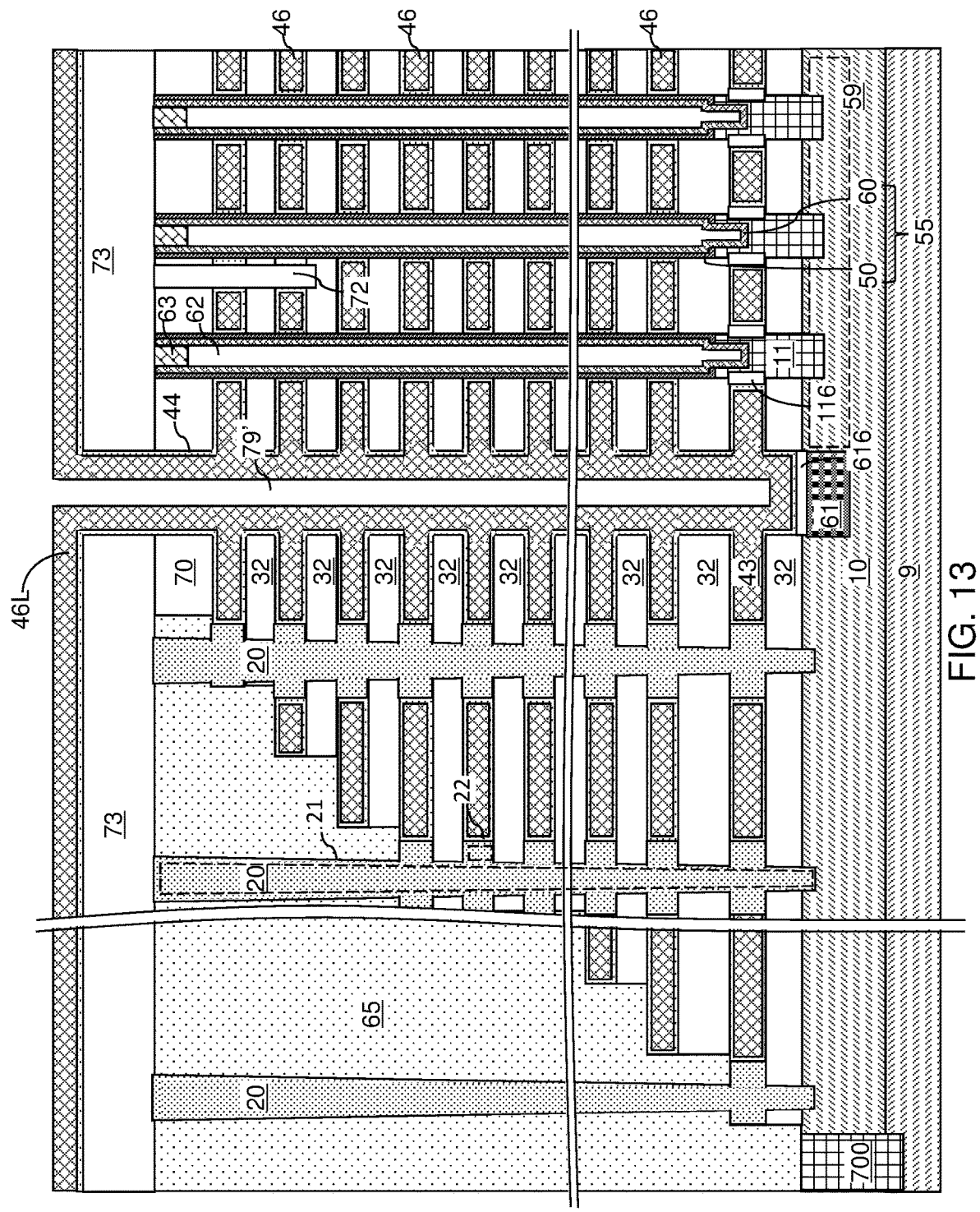
FIG. 13 is a schematic vertical cross-sectional view of the first exemplary structure at the processing step of FIG. 12D.

Referring to FIGS. 12D and 13, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 14A:
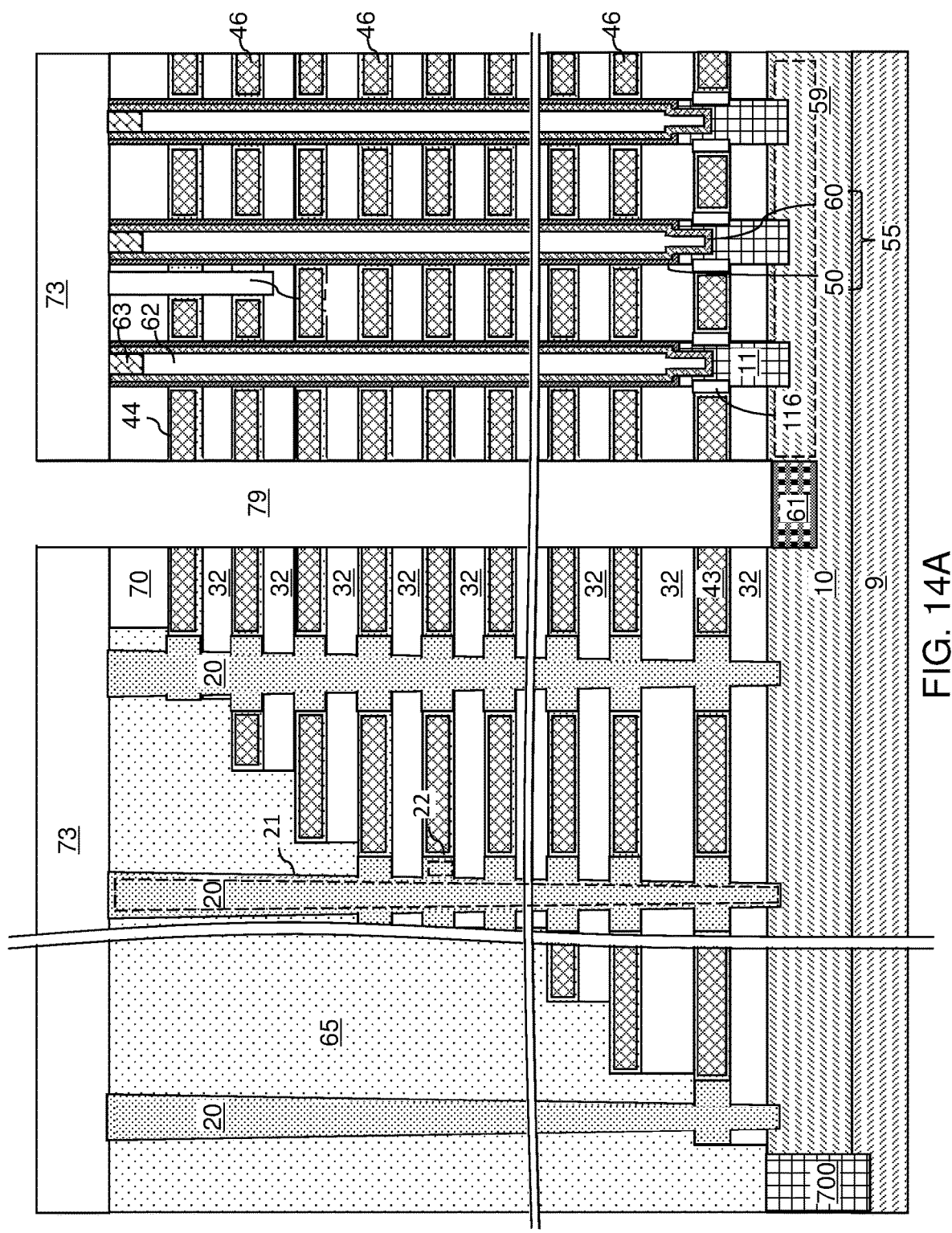
FIG. 14A is a schematic vertical cross-sectional view of the first exemplary structure after removal of a deposited conductive material from within the backside trench according to an embodiment of the present disclosure.
Figure 14B:
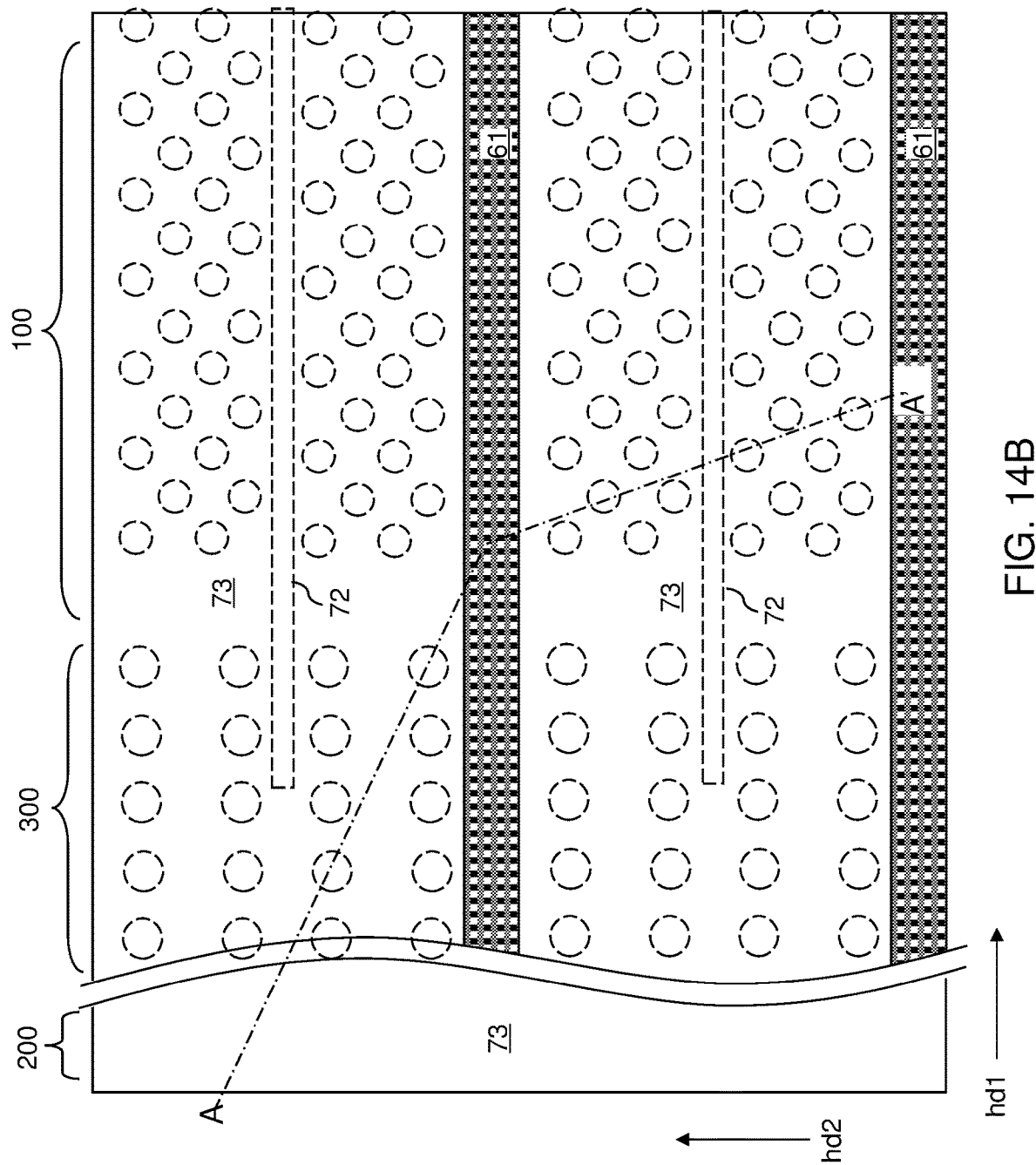
FIG. 14B is a top-down view of the first exemplary structure of FIG. 14A. The vertical plane A-A' is the plane of the cross-section for FIG. 14A.

Referring to FIGS. 14A and 14B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 15A:
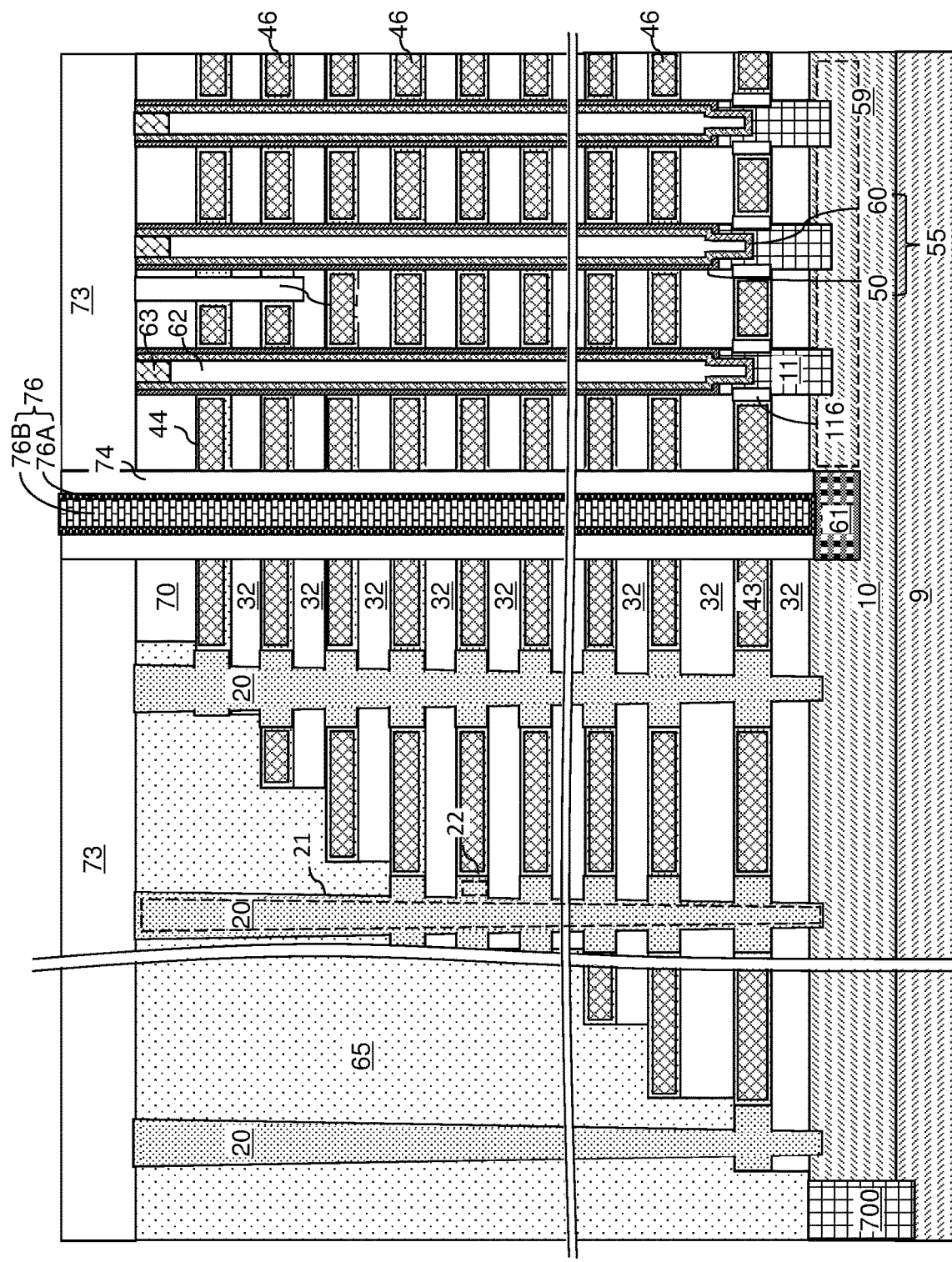
FIG. 15A is a schematic vertical cross-sectional view of the first exemplary structure after formation of an insulating spacer and a backside contact structure according to an embodiment of the present disclosure.
Figure 15B:
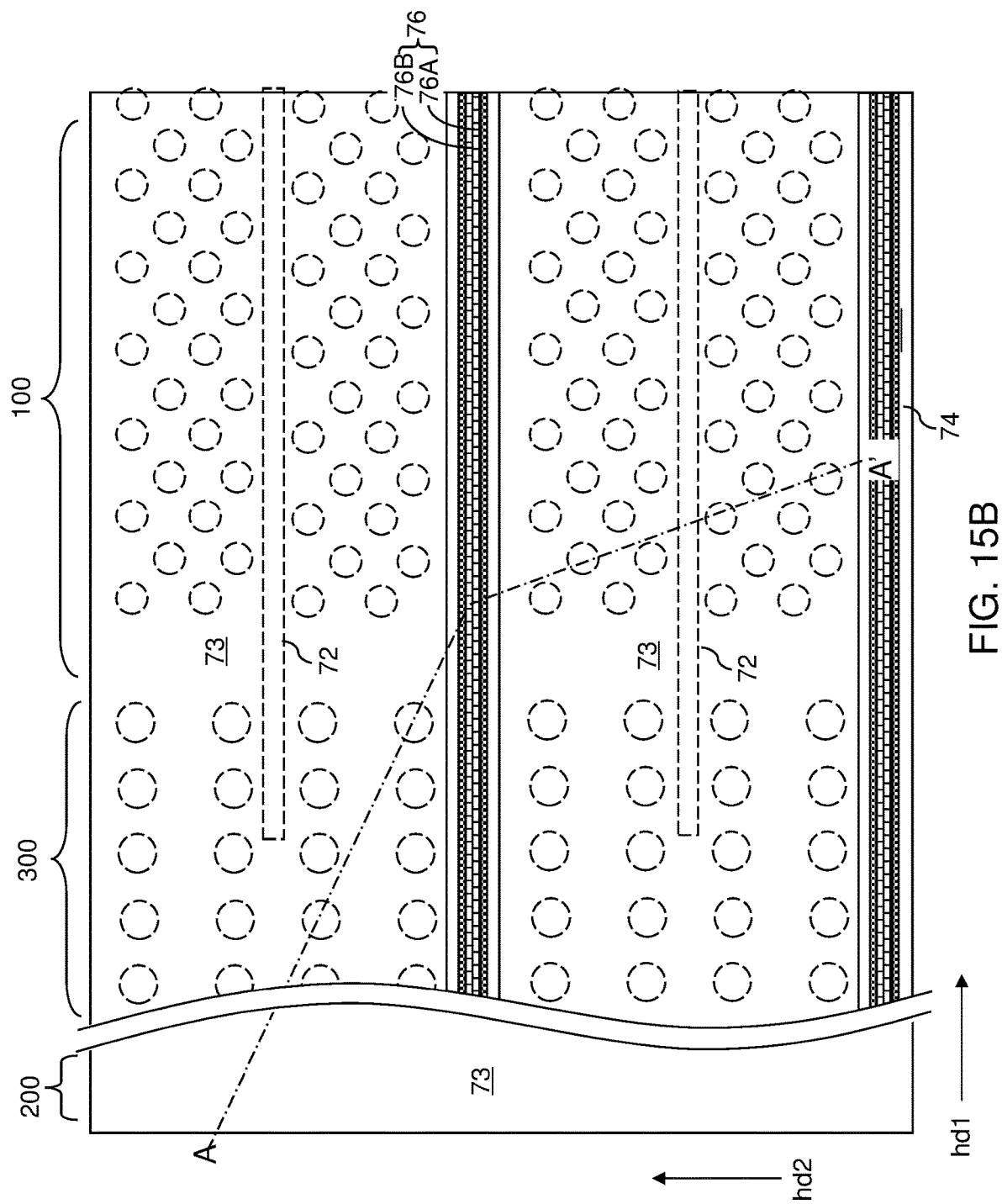
FIG. 15B is a magnified view of a region of the first exemplary structure of FIG. 15A.

Referring to FIGS. 15A and 15B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 16A:
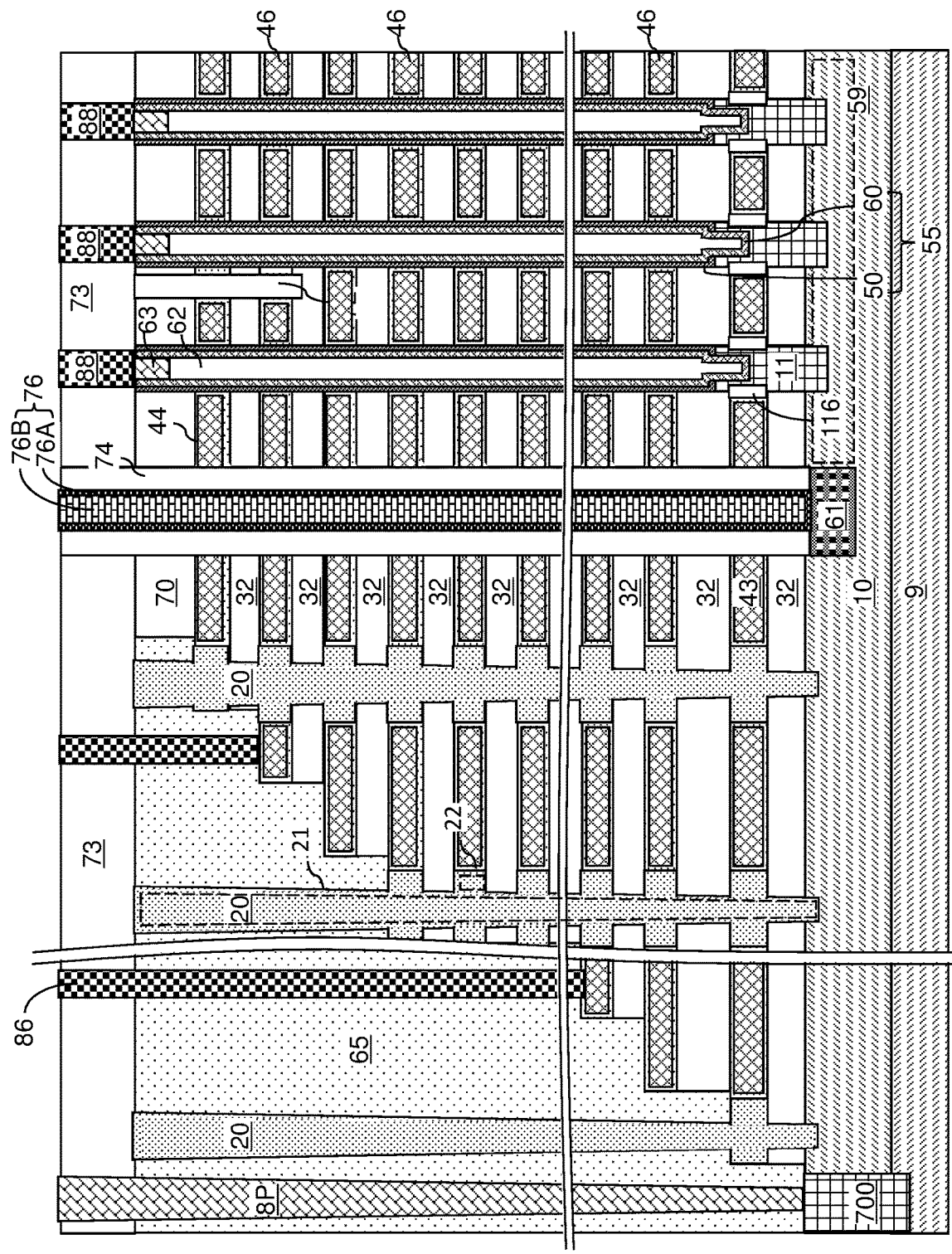
FIG. 16A is a schematic vertical cross-sectional view of the first exemplary structure after formation of additional contact via structures according to an embodiment of the present disclosure.
Figure 16B:
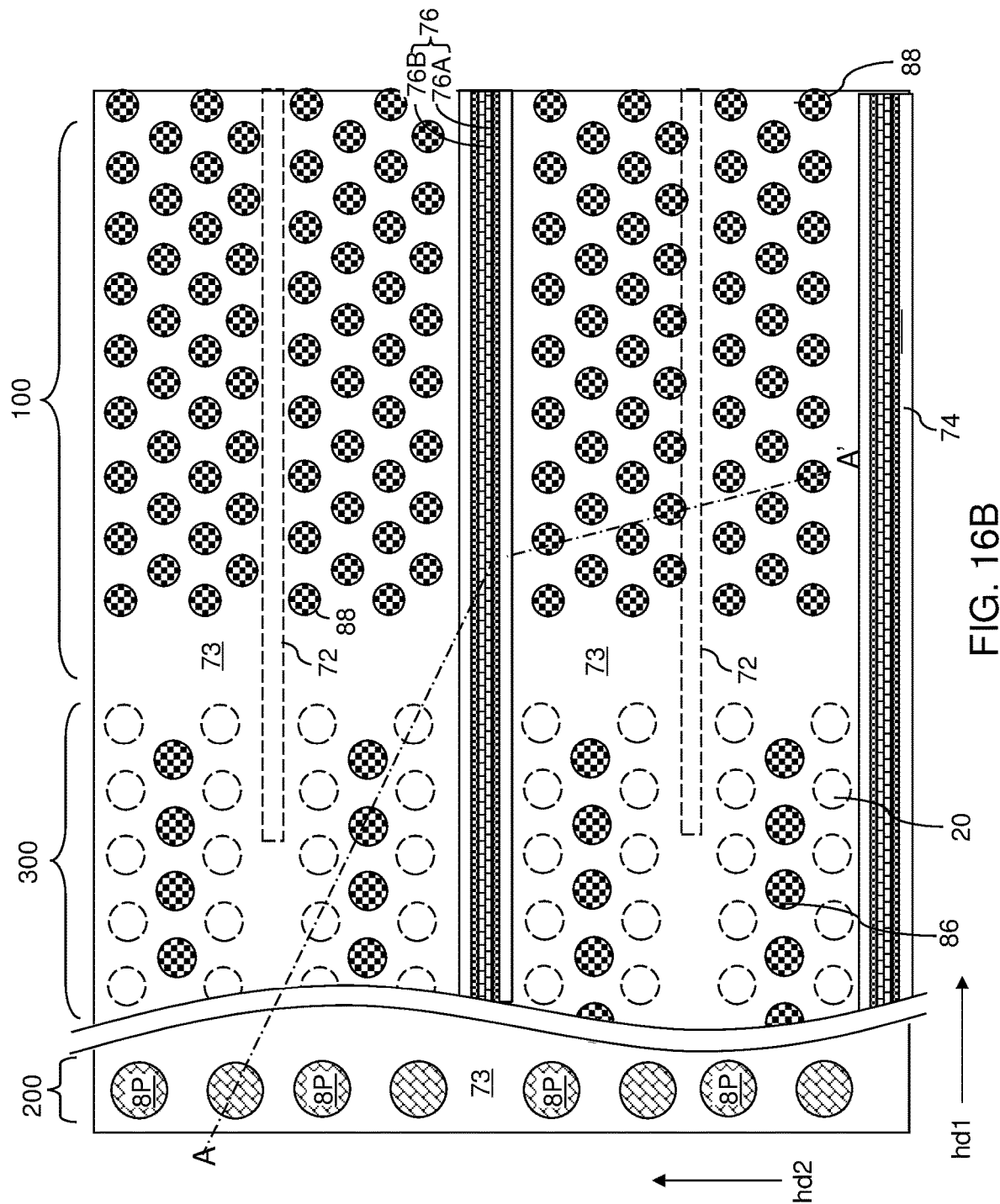
FIG. 16B is a top-down view of the first exemplary structure of FIG. 16A. The vertical plane A-A' is the plane of the schematic vertical cross-sectional view of FIG. 16A.

Referring to FIGS. 16A and 16B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

If the vias filled with the word line contact via structures 86 are misaligned during their formation by photolithography and etching, then such vias may overlap with the support openings 19 filled with the support pillar structures 20. The etching of the misaligned vias through the silicon oxide retro-stepped dielectric material portion 65 may also etch away the silicon oxide material of the support pillar structures 20 and expose portions of the support openings 19. In such a case, formation of the word line contact via structures 86 in the exposed portions of the support openings 19 may cause a short circuit between several vertically separated electrically conductive layers 46 in the alternating stack. However, in the embodiment in which the support pillar structure 20 includes a stack including at least one silicon oxide layer and a metal oxide dielectric material layer, the metal oxide dielectric material layer acts as a lateral etch stop during the etching of the misaligned vias and prevents plural electrically conductive layers from being exposed in the misaligned vias. This prevents short circuits between several vertically separated electrically conductive layers 46 in the alternating stack even if the vias are misaligned and overlap with the support pillar structures 20.

Referring to all drawings and according to various embodiments of the present disclosure, a three-dimensional memory device is provided, which comprises: an alternating stack of insulating layers 32 and electrically conductive layers 46; memory openings 49 vertically extending through a first region 100 of the alternating stack; memory opening fill structures 58 located in the memory openings 49 and comprising a respective vertical stack of memory elements located levels of the electrically conductive layers 46; and a support pillar structure 20 vertically extending through a second region 300 of the alternating stack and comprising a central columnar structure 21 and a set of fins 22 laterally protruding from the central columnar structure 21 at levels of a subset of the electrically conductive layers 46.

In one embodiment, the vertical stack of memory elements comprises portions of a memory material layer 54, each of the memory opening fill structures 58 lacks the fins 22, and each of the memory opening fill structures 58 further comprises a respective vertical semiconductor channel 60. The central columnar structure 21 and the fins 22 can have a circular horizontal cross sectional shape, with the fins having a larger diameter than the central columnar structure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device, comprising:
an alternating stack of insulating layers and electrically conductive layers;
memory openings vertically extending through a first region of the alternating stack;

memory opening fill structures located in the memory openings and comprising a respective vertical stack of memory elements located at levels of the electrically conductive layers;

a support pillar structure vertically extending through a second region of the alternating stack and comprising a central columnar structure and a set of fins laterally protruding from the central columnar structure at levels of a subset of the electrically conductive layers, wherein the second region comprises a staircase region in which the alternating stack comprises stepped surfaces; and a retro-stepped dielectric material portion that overlies the stepped surfaces, wherein:

the support pillar structure vertically extends through the retro-stepped dielectric material portion;

a first subset of the electrically conductive layers overlies a horizontal plane including a horizontal interface between a topmost fin of the set of fins and a horizontal surface segment of a stepped bottom surface of the retro-stepped dielectric material portion; and a second subset of the electrically conductive layers underlies the horizontal plane.

2. The three-dimensional memory device of claim 1, wherein a bottom lateral protrusion distance between the central columnar structure and a cylindrical sidewall of a bottommost fin within the set of fins is smaller than a top lateral protrusion distance between the central columnar structure and a cylindrical sidewall of a topmost fin within the set of fins.

3. The three-dimensional memory device of claim 1, wherein:

the set of fins has a variable lateral protrusion distance as measured between the central columnar structure and a cylindrical sidewall of a respective fin; and the variable lateral protrusion distance increases gradually with a vertical distance from the substrate.

4. The three-dimensional memory device of claim 1, wherein:

the set of fins has a variable lateral protrusion distance as measured between the central columnar structure and a cylindrical sidewall of a respective fin; and the variable lateral protrusion distance increases stepwise with a vertical distance from the substrate.

5. The three-dimensional memory device of claim 1, wherein:

a bottommost fin within the set of fins has a bottom fin lateral extent that is a maximum lateral dimension within the bottommost fin;

a topmost fin within the set of fins has a top fin lateral extent that is a maximum lateral dimension within the topmost fin; and the bottommost fin lateral extent is smaller than the topmost fin lateral extent.

6. The three-dimensional memory device of claim 1, wherein the central columnar structure has a variable lateral extent such that a topmost portion of the central columnar structure that is not adjoined to any fin within the set of fins has a greater width than a bottommost portion of the central columnar structure that is not adjoined to any fin within the set of fins.

7. The three-dimensional memory device of claim 1, wherein the set of fins has a same lateral protrusion distance as measured between the central columnar structure and a cylindrical sidewall of a respective fin, and all fins within the set of fins have a same lateral extent.

8. The three-dimensional memory device of claim 1, wherein each layer within the alternating stack is present within the first region.

9. The three-dimensional memory device of claim 1, wherein the support pillar structure comprises a dielectric pillar structure that consists essentially of a dielectric material selected from:

(i) silicon oxide; or (ii) a stack comprising at least one silicon oxide layer and a metal oxide dielectric material layer.

10. The three-dimensional memory device of claim 1, wherein the support pillar structure is free of any fin above the horizontal plane and the entire set of the fins is located below the horizontal plane, and the support pillar structure comprises a straight sidewall that vertically extends from a top surface of the retro-stepped dielectric material portion to the horizontal plane.

11. The three-dimensional memory device of claim 10, further comprising additional support pillar structures vertically extending through the second region of the alternating stack and comprising a respective central columnar structure and a respective set of fins laterally protruding from the respective central columnar structure at levels of a respective subset of the electrically conductive layers, wherein a total number of fins per support pillar structure differs for at least one pair of additional support pillar structures of the additional support pillar structures.

12. The three-dimensional memory device of claim 1, further comprising layer contact via structures located over the second region of the alternating stack and vertically extending through the retro-stepped dielectric material portion and contacting a top surface of a respective one of the electrically conductive layers.

13. The three-dimensional memory device of claim 1, wherein:

the vertical stack of memory elements comprises portions of a memory material layer;

each of the memory opening fill structures lacks the fins; and each of the memory opening fill structures further comprises a respective vertical semiconductor channel.

14. A method of forming a three-dimensional memory device, comprising:

forming an alternating stack of insulating layers and sacrificial material layers over a substrate;

forming stepped surfaces by patterning the alternating stack in a staircase region;

forming a retro-stepped dielectric material portion over the stepped surfaces;

forming support openings through the alternating stack and through the retro-stepped dielectric material portion;

laterally recessing the sacrificial material layers selective to the insulating layers around the support openings by introducing into the support openings an isotropic etchant that etches the sacrificial material layers selective to the insulating layers and selective to the retro-stepped dielectric material portion, wherein fin cavities are formed in volumes from the sacrificial material layers are etched, and wherein a first support opening of the support openings comprises a first subset of the fin cavities such that a first subset of the sacrificial material layers overlies a horizontal plane including a horizontal interface between the retro-stepped dielectric material portion and a topmost fin cavity within the first subset of the fin cavities, and a second subset of the sacrificial material layers underlies the horizontal plane;

forming support pillar structures in volumes of the support openings and the fin cavities by depositing at least one fill material in the support openings and the fin cavities, wherein each of the support pillar structures comprises a central columnar structure and a set of fins laterally protruding from the central columnar structure at levels of a subset of the sacrificial material layers;

forming memory openings through a region of the alternating stack that is laterally spaced from the support pillar structures;

forming memory opening fill structures in the memory openings, wherein each of the memory opening fill structures comprises a respective vertical stack of memory elements located at levels of the sacrificial material layers; and replacing the sacrificial material layers with electrically conductive layers.

15. The method of claim 14, wherein the sacrificial material layers comprise:
a first sacrificial material layer having a first etch rate in the isotropic etchant; and
a second sacrificial material layer having a second etch rate in the isotropic etchant that is greater than the first etch rate, and overlying the first sacrificial material layer.

16. The method of claim 15, wherein the sacrificial material layers further comprise a third sacrificial material layer having a third etch rate in the isotropic etchant that is greater than the second etch rate, and overlying the second sacrificial material layer.

17. The method of claim 15, wherein:
the first sacrificial material layer comprises a first silicon nitride material having a first density; and
the second sacrificial material layer comprises a second silicon nitride material having a second density lower than the first density.

18. The method of claim 14, wherein:
the support openings are formed through the stepped surfaces;
the first support opening is free of any fin cavity above the horizontal plane; and
a first support pillar structure of the support pillar structures is formed within the first support opening and comprises a straight sidewall that vertically extends from a top surface of the retro-stepped dielectric material portion to the horizontal plane.

19. The method of claim 14, wherein:
the support pillar structure comprises a dielectric pillar structure that consists essentially of a dielectric material;
the vertical stack of memory elements comprises portions of a memory material layer;
each of the memory opening fill structures lacks the fins; and
each of the memory opening fill structures further comprises a respective vertical semiconductor channel.

20. The method of claim 14, further comprising:
forming backside trenches through the alternating stack;
forming backside recesses by removing the sacrificial material layers selective to the insulating layers, the support pillar structures, and the memory opening fill structures by introducing another isotropic etchant into the backside trenches, wherein cylindrical surfaces of the fins of the support pillar structures are physically exposed to the backside recesses; and
forming the electrically conductive layers in the backside recesses by depositing at least one conductive material in the backside recesses.

* * * * *